(12) United States Patent
Jung et al.

(10) Patent No.: US 12,170,221 B2
(45) Date of Patent: Dec. 17, 2024

(54) APPARATUS FOR PROCESSING SUBSTRATE

(71) Applicant: JUSUNG ENGINEERING CO., LTD., Gwangju-si (KR)

(72) Inventors: Won Woo Jung, Gwangju-si (KR); Young-Rok Kim, Gwangju-si (KR); Yoo Seong Kim, Gwangju-si (KR); Jong Sik Kim, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 271 days.

(21) Appl. No.: 17/042,091

(22) PCT Filed: Mar. 27, 2019

(86) PCT No.: PCT/KR2019/003573
§ 371 (c)(1),
(2) Date: Sep. 25, 2020

(87) PCT Pub. No.: WO2019/194459
PCT Pub. Date: Oct. 10, 2019

(65) Prior Publication Data
US 2021/0193501 A1 Jun. 24, 2021

(30) Foreign Application Priority Data
Apr. 3, 2018 (KR) .......................... 10-2018-0038594
Dec. 18, 2018 (KR) .......................... 10-2018-0164262

(51) Int. Cl.
*H01L 21/687* (2006.01)
*C23C 16/458* (2006.01)

(52) U.S. Cl.
CPC ...... *H01L 21/6875* (2013.01); *C23C 16/4584* (2013.01); *H01L 21/68764* (2013.01); *H01L 21/68771* (2013.01)

(58) Field of Classification Search
CPC ................................ C23C 16/45587–45591
See application file for complete search history.

(56) References Cited

U.S. PATENT DOCUMENTS 6,436,796 B1 * 8/2002 Mailho .................. C30B 25/10
438/758
8,021,487 B2 * 9/2011 Boguslavskiy ... H01L 21/68764
156/345.55
(Continued)

FOREIGN PATENT DOCUMENTS

CN 101740448 A 6/2010
JP 2017084970 A 5/2017
(Continued)

*Primary Examiner* — Charlee J. C. Bennett
(74) *Attorney, Agent, or Firm* — Renaissance IP Law Group LLP

(57) ABSTRACT

The present inventive concept relates to a substrate processing apparatus including a supporting part for supporting a substrate; a disk supporting a plurality of the supporting parts; a lid disposed on the disk; and a first protrusion portion coupled to the disk to protrude in an upward direction from the disk to the lid in a center region disposed inward from the supporting parts and a gap region disposed between the supporting parts.

17 Claims, 17 Drawing Sheets

(56) References Cited

U.S. PATENT DOCUMENTS

| | | | | |
|---|---|---|---|---|
| 8,465,591 | B2* | 6/2013 | Kato | C23C 16/45521 118/730 |
| 2003/0221624 | A1* | 12/2003 | Jurgensen | C30B 25/12 118/728 |
| 2004/0231599 | A1* | 11/2004 | Schwambera | C23C 16/45563 118/728 |
| 2010/0055319 | A1* | 3/2010 | Kato | H01L 21/68764 118/725 |
| 2011/0114130 | A1* | 5/2011 | Kang | C23C 16/4405 134/22.1 |
| 2011/0223334 | A1* | 9/2011 | Yudovsky | C23C 16/45504 118/715 |
| 2011/0303154 | A1* | 12/2011 | Kim | C23C 16/45521 118/728 |
| 2012/0031338 | A1* | 2/2012 | Lee | C23C 16/4586 118/724 |
| 2012/0234229 | A1* | 9/2012 | Nguyen | C23C 16/4583 117/88 |
| 2013/0149467 | A1* | 6/2013 | Kato | C23C 16/54 118/719 |
| 2015/0187620 | A1* | 7/2015 | Gurary | H01L 21/68764 118/728 |
| 2017/0092480 | A1 | 3/2017 | Yi et al. | |
| 2017/0125282 | A1* | 5/2017 | Umehara | H01L 21/68771 |

FOREIGN PATENT DOCUMENTS

| | | |
|---|---|---|
| KR | 20100077889 A | 7/2010 |
| KR | 20130061407 A | 6/2013 |
| KR | 20160081439 A | 7/2016 |
| KR | 20160089657 A | 7/2016 |
| KR | 20170049399 A | 5/2017 |
| KR | 20170136280 A | 12/2017 |
| KR | 20180003031 A | 1/2018 |
| TW | 201519353 A | 5/2015 |

* cited by examiner

APPARATUS FOR PROCESSING SUBSTRATE

TECHNICAL FIELD

The present disclosure relates to a substrate processing apparatus which performs a processing process such as a deposition process and an etching process on a substrate.

BACKGROUND ART

Generally, a thin-film layer, a thin-film circuit pattern, or an optical pattern should be formed on a substrate for manufacturing a solar cell, a semiconductor device, a flat panel display device, etc. To this end, a processing process is performed, and examples of the processing process include a deposition process of depositing a thin film including a specific material on a substrate, a photo process of selectively exposing a portion of a thin film by using a photosensitive material, an etching process of removing the selectively exposed portion of the thin film to form a pattern, etc.

FIG. 1 is a schematic side cross-sectional view of a related art substrate processing apparatus.

Referring to FIG. 1, a related art substrate processing apparatus 10 includes a disk 11 which rotates about a rotational shaft 11a, a distribution unit 12 which distributes a process gas, and a purge unit 13 which distributes a purge gas.

The disk 11 rotates a plurality of substrates 20 and 20' with respect to the rotational shaft 11a while rotating about the rotational shaft 11a.

The distribution unit 12 distributes the process gas to a plurality of processing regions PA1 and PA2. The processing regions PA1 and PA2 are disposed in a path through which the substrates 20 and 20' rotate about the rotational shaft 11a. The process gas is for performing a processing process such as a deposition process and an etching process. The distribution unit 12 distributes different kinds of process gases to the processing regions PA1 and PA2, The purge unit 13 distributes the purge gas to a center region CA where the rotational shaft 11a is disposed. The center region CA is disposed between the processing regions PA1 and PA2. The purge unit 13 distributes the purge gas to the center region CA, and thus, prevents the different kinds of process gases, distributed through the center region CA from the distribution unit 12, from being mixed with one another.

Although not shown, the related art substrate processing apparatus 10 includes a division mechanism which distributes the purge gas so as to divide the processing regions PA1 and PA2. The division mechanism distributes the purge gas to a space between the processing regions PA1 and PA2, and thus, prevents the different kinds of process gases, distributed through the space between the processing regions PA1 and PA2 from the distribution unit 12, from being mixed with one another.

Here, when the amount of purge gas distributed to the center region CA by the purge unit 13 is high, the process gas distributed to the processing regions PA1 and PA2 by the distribution unit 12 is pushed in an outward direction by the purge gas. When the amount of purge gas distributed to the center region CA by the purge unit 13 is low, the process gas distributed to the processing regions PA1 and PA2 by the distribution unit 12 is diffused to the center region CA. The process gas diffused to the center region CA stays in the center region CA and then is pushed in the outward direction by the purge gas and a centrifugal force which acts based on a rotation of the disk 11, thereby moving to the processing regions PA1 and PA2 again.

Therefore, in the related art substrate processing apparatus 10, different process gases are mixed, and different process results are shown between an inner portion close to the center region CA and the other portion in the substrates 20 and 20'. Due to this, the related art substrate processing apparatus 10 has a problem where the uniformity of a processing process performed on the substrates 20 and 20' is reduced due to the center region CA which is empty.

Disclosure

Technical Problem

The present inventive concept is devised to solve the above-described problem and is for providing substrate processing apparatuses for enhancing the uniformity of a processing process performed on a substrate.

Technical Solution

To accomplish the above-described objects, the present inventive concept may include below-described elements.

A substrate processing apparatus according to the present inventive concept may include a supporting part for supporting a substrate; a disk supporting a plurality of the supporting parts; a lid disposed on the disk; and a first protrusion portion coupled to the disk to protrude in an upward direction from the disk to the lid in a center region disposed inward from the supporting parts and a gap region disposed between the supporting parts.

A substrate processing apparatus according to the present inventive concept may include a supporting part for supporting a substrate; a disk coupled to a plurality of the supporting parts, substrates supported by the supporting parts rotating about a rotational shaft; a lid disposed on the disk; a distribution unit coupled to the lid to distribute a process gas to a plurality of processing regions disposed with respect to the rotational shaft; a purge unit coupled to the lid to distribute a purge gas; and a first protrusion portion coupled to the disk to protrude in an upward direction from the disk to the lid in a center region disposed inward from the supporting parts and a gap region disposed between the supporting parts.

Advantageous Effect

According to the present inventive concept, the following effects can be obtained.

The present inventive concept may be implemented to decrease a size of an empty space in a center region, and thus, may enhance the uniformity of a processing process performed on a substrate.

The present inventive concept may be implemented to decrease a size of an empty space between supporting parts, and thus, may more enhance the uniformity of the processing process performed on the substrate.

DETAILED DESCRIPTION

Hereinafter, an embodiment of a substrate processing apparatus according to the present inventive concept will be described in detail with reference to the accompanying drawings.

Figure 1:
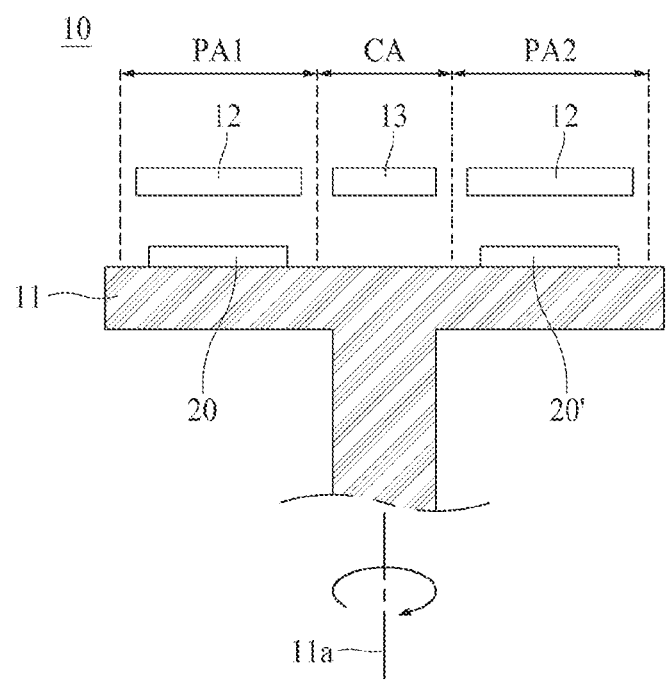
FIG. 1 is a schematic side cross-sectional view of a related art substrate processing apparatus.
Figure 2:
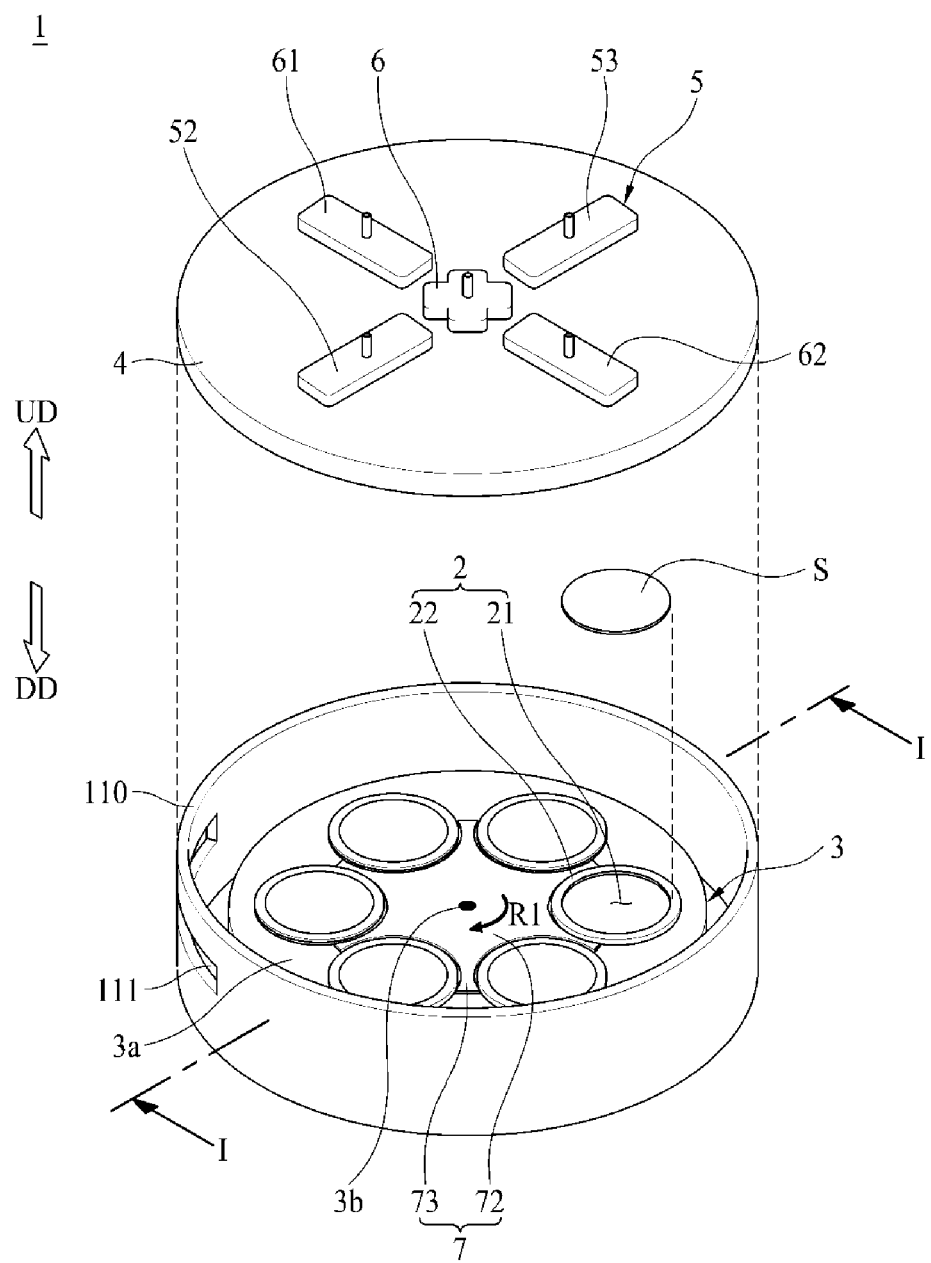
FIG. 2 is a schematic exploded perspective view of a substrate processing apparatus according to the present inventive concept.

Referring to FIG. 2, a substrate processing apparatus 1 according to the present inventive concept performs a processing process on a substrate S. For example, the substrate processing apparatus 1 according to the present inventive concept may perform at least one of a deposition process of depositing a thin film on the substrate S and an etching process of removing a portion of the thin film deposited on the substrate S. The substrate processing apparatus 1 according to the present inventive concept includes a supporting part 2, a disk 3, a lid 4, a distribution unit 5, a purge unit 6, and a first protrusion portion 7.

Figure 3:
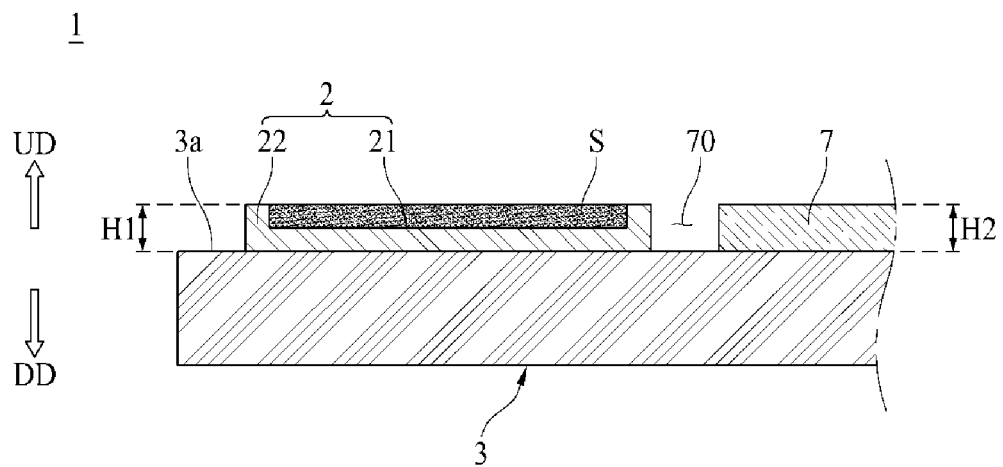
FIG. 3 is a schematic side cross-sectional view of a supporting part, a disk, and a first protrusion portion each taken along line I-I of FIG. 2 in a substrate processing apparatus according to the present inventive concept.
Figure 4:
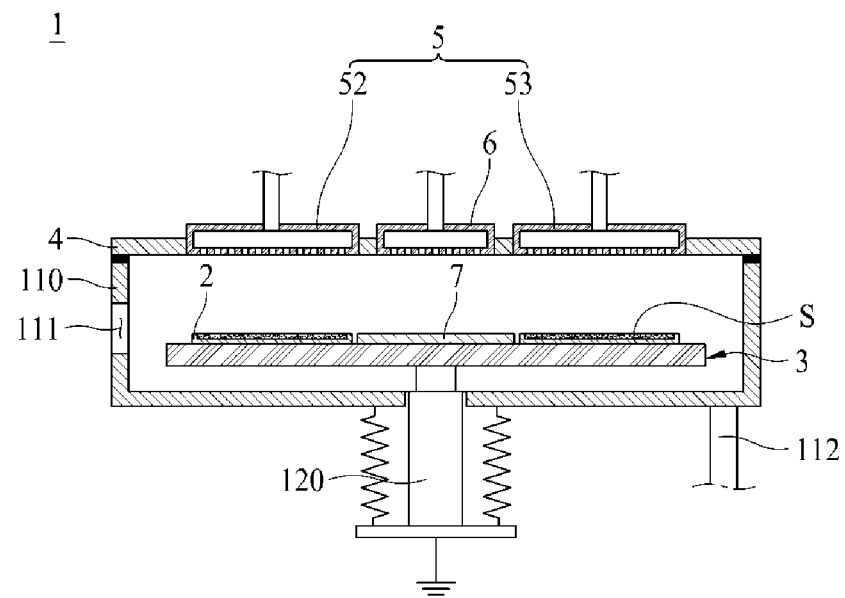
FIG. 4 is a schematic side cross-sectional view of a substrate processing apparatus according to the present inventive concept.

Referring to FIGS. 2 to 4, the supporting part 2 supports the substrate S. The substrate S may be placed in the supporting part 2, and thus, may be supported by the supporting part 2. The substrate S may be a semiconductor substrate or a wafer.

The supporting part 2 may include a supporting groove 21 and a supporting wall 22.

The substrate S is inserted into the supporting groove 21. The supporting groove 21 may be provided in an upper surface of the supporting part 2. The supporting groove 21 may be formed by processing a groove by a certain depth in the upper surface of the supporting part 2. The substrate S may be inserted into the supporting groove 21 and may be supported by the supporting part 2. The supporting groove 21 and the substrate S may be provided to have a shape and a size each matching each other.

The supporting wall 22 is disposed to surround the supporting groove 21. When the substrate S is inserted into the supporting groove 21, the substrate S may be disposed in an inner portion of the supporting wall 22. When the substrate S is inserted into the supporting groove 21, an upper surface of the substrate S and an upper surface of the supporting wall 22 may be disposed to have the same height as illustrated in FIG. 3. In this case, the upper surface of the substrate S supported by the supporting part 2 and the upper surface of the supporting wall 22 may be spaced apart from an upper surface 3a of the disk 3 by the same height.

Referring to FIGS. 2 to 5, the disk 3 supports a plurality of substrates S. The disk 3 may be coupled to an inner portion of a chamber 110 which provides a processing space where the processing process is performed. A substrate entrance 111 (illustrated in FIG. 4) may be coupled to the chamber 110. The substrates S may pass through the substrate entrance 111 and may be loaded into the chamber 110 by a loading apparatus (not shown). When the processing process is completed, the substrates S may pass through the substrate entrance 111 and may be unloaded to the outside of the chamber 110 by an unloading apparatus (not shown). An exhaust unit 112 (illustrated in FIG. 4) for exhausting a gas, remaining in the processing space, to the outside may be coupled to the chamber 110.

A plurality of supporting parts 2 may be coupled to the disk 3. When the substrates S are supported by the supporting parts 2, the disk 3 may support the supporting parts 2 to support the substrates S. The supporting parts 2 may be coupled to the disk 3 so as to protrude in an upward direction UD (an arrow direction) from the upper surface 3a of the disk 3. Therefore, upper surfaces of the substrates S supported by the supporting parts 2 may be disposed at positions spaced apart from the upper surface 3a of the disk 3 in the upward direction UD (the arrow direction). The supporting parts 2 may support the substrates S so that the upper surfaces of the substrates S are spaced apart from the upper surface 3a of the disk 3 by a first height H1 (illustrated in FIG. 3) in the upward direction UD (the arrow direction). In this case, each of the supporting parts 2 may protrude by the first height H1 in the upward direction UD (the arrow direction) from the upper surface 3a of the disk 3.

Figure 5:
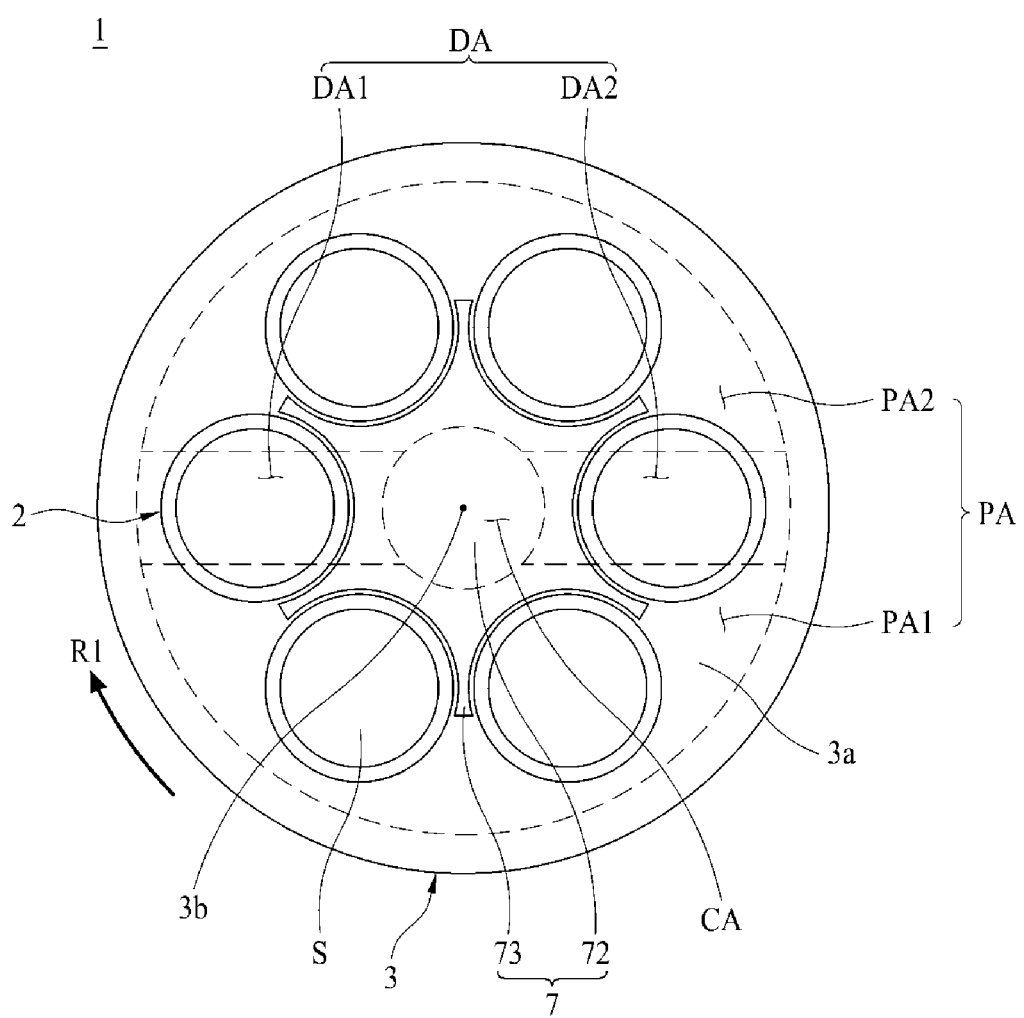
FIG. 5 is a schematic plan view of a supporting part, a disk, and a first protrusion portion in a substrate processing apparatus according to the present inventive concept.

The disk 3 may rotate about a rotational shaft 3b (illustrated in FIG. 5). The disk 3 may rotate in a first rotational direction R1 (an arrow direction) (illustrated in FIG. 5). The first rotational direction R1 (the arrow direction) may be a clockwise direction or a counterclockwise direction with respect to the rotational shaft 3b. The supporting parts 2 may be coupled to the disk 3 so as to be spaced apart from one another at the same angle in the first rotational direction R1 (the arrow direction) with respect to the rotational shaft 3b.

In FIGS. 2 and 5, six supporting parts 2 are illustrated as being coupled to the disk 3, but are not limited thereto. Two, three, four, five, or seven or more supporting parts 2 may be coupled to the disk 3.

As the disk 3 rotates about the rotational shaft 3b, the substrates S supported by the supporting parts 2 may rotate about the rotational shaft 3b. In this case, the substrates S supported by the supporting parts 2 may revolve about the rotational shaft 3b. The disk 3 may be coupled to a driver 120 (illustrated in FIG. 4) which provides a rotational force. Each of the supporting parts 2 may be rotatably coupled to the disk 3. In this case, each of the supporting parts 2 may rotate about a rotational shaft thereof. Accordingly, the substrate processing apparatus 1 according to the present inventive concept may be implemented so that the processing process is performed on the substrates S supported by the supporting parts 2 while the substrates S are rotating and revolving.

Referring to FIGS. 2 to 5, the lid 4 is disposed on the disk 3. The lid 4 may be coupled to the chamber 110 to cover an upper portion of the chamber 110. The lid 4 and the chamber 110 may be provided in a cylindrical structure as illustrated in FIG. 2, but are not limited thereto and may be provided in an elliptical structure, a polygonal structure, or the like.

The lid 4 may be disposed apart from the disk 3 in the upward direction UD (the arrow direction). The lid 4 may support the distribution unit 5 and the purge unit 6. Each of the distribution unit 5 and the purge unit 6 may be disposed apart from the disk 3 in the upward direction UD (the arrow direction) and may be coupled to the lid 4.

Referring to FIGS. 2 to 6, the distribution unit distributes a process gas. The distribution unit 5 may be disposed apart from the disk 3 in the upward direction UD (the arrow direction). Therefore, the distribution unit 5 may distribute the process gas in a downward direction DD (an arrow direction) toward the disk 3. The distribution unit 5 may be coupled to the lid 4. The distribution unit 5 may distribute the process gas to a processing region PA (illustrated in FIG. 5). Accordingly, the substrate processing apparatus 1 according to the present inventive concept may be implemented so that a processing process using the process gas is performed on a substrate S located in the processing region PA. When the substrates S rotate about the rotational shaft 3b, the distribution unit 5 may distribute the process gas to a plurality of processing regions PA1 and PA2 (illustrated in FIG. 5) disposed along a rotational path through which the substrates S rotate. The rotational path denotes a path through which the supporting parts 2 pass while rotating about the rotational shaft 3b of the disk 3. In this case, the substrates S may sequentially pass through the processing regions PA1 and PA2 while rotating along the rotational path.

Figure 6:
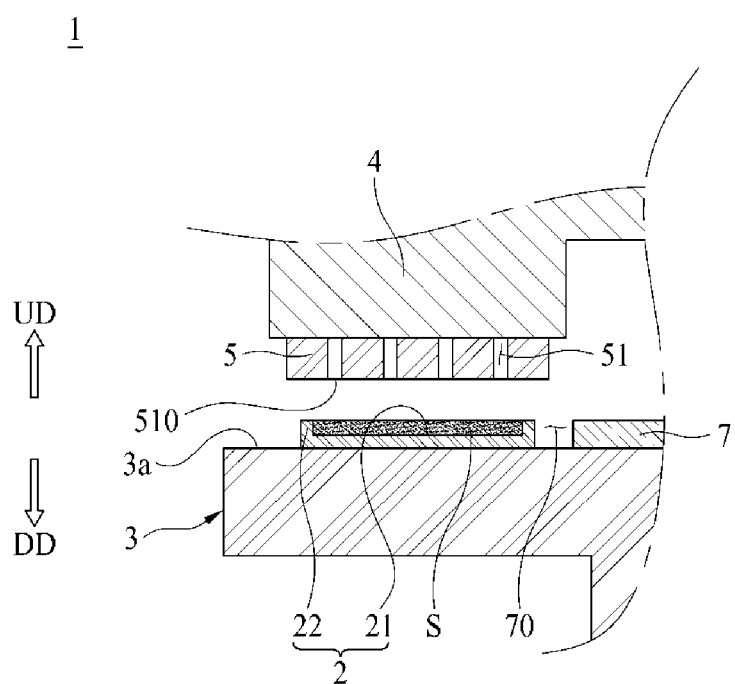
FIG. 6 is a schematic side cross-sectional view of a supporting part, a disk, a first protrusion portion, and a distribution unit each taken along line I-I of FIG. 2 in a substrate processing apparatus according to the present inventive concept.
Figure 7:
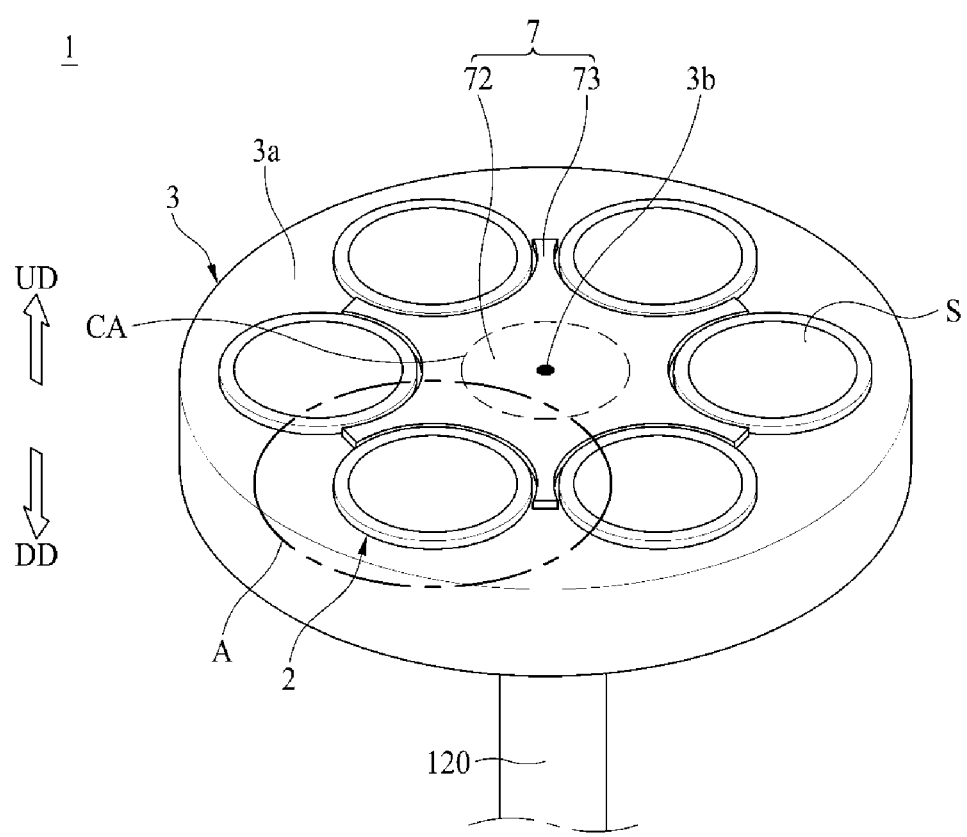
FIG. 7 is a schematic perspective view of a supporting part, a disk, and a first protrusion portion in a substrate processing apparatus according to the present inventive concept.

The distribution unit 5 may include a distribution hole 51 (illustrated in FIG. 6).

The distribution unit 5 may distribute the process gas in the downward direction DD (an arrow direction) toward the disk 3 through the distribution hole 51. The distribution unit 5 may be coupled to the lid 4 so that a lower end 510 (illustrated in FIG. 6) of the distribution hole 51 is disposed at a position spaced apart from the disk 3 in the upward direction UD (the arrow direction). The distribution unit 5 may include a plurality of distribution holes 51. In this case, the distribution holes 51 may be disposed apart from one another.

The distribution unit 5 may include a first distribution mechanism 52 (illustrated in FIG. 2) and a second distribution mechanism 53 (illustrated in FIG. 2).

The first distribution mechanism 52 distributes a source gas among process gases. The first distribution mechanism 52 may be coupled to the lid 4 so as to be disposed on the disk 3. The first distribution mechanism 52 may distribute the source gas to a first processing region PA1 (illustrated in FIG. 5). The first processing region PA1 corresponds to a portion of a processing space disposed between the distribution unit 5 and the disk 3. When the disk 3 rotates about the rotational shaft 3b, the substrates S supported by the disk 3 may sequentially pass through the first processing region PA1 while rotating about the rotational shaft 3b. Therefore, a processing process using the source gas may be performed on substrates S passing through the first processing region PA1. Although not shown, the distribution unit 5 may include a plurality of first distribution mechanisms 52. In this case, the first distribution mechanisms 52 may be disposed at positions spaced apart from one another long the rotational path.

The second distribution mechanism 53 distributes a reactant gas among the process gases. The second distribution mechanism 53 may be coupled to the lid 4 so as to be disposed on the disk 3. The second distribution mechanism 53 may distribute the reactant gas to a second processing region PA2 (illustrated in FIG. 5). The second processing region PA2 corresponds to a portion of the processing space disposed between the distribution unit 5 and the disk 3. The second processing region PA2 and the first processing region PA1 may be disposed at different positions along the rotational path. When the disk 3 rotates about the rotational shaft 3b, the substrates S supported by the disk 3 may sequentially pass through the second processing region PA2 while rotating about the rotational shaft 3b. Therefore, a processing process using the reactant gas may be performed on substrates S passing through the second processing region PA2. Although not shown, the distribution unit 5 may include a plurality of second distribution mechanisms 53. In this case, the second distribution mechanisms 53 may be disposed at positions spaced apart from one another long the rotational path.

Referring to FIGS. 2 to 6, the purge unit 6 (illustrated in FIG. 2) distributes a purge gas through holes (illustrated in FIG. 4) formed therein. The purge unit 6 may be disposed on the disk 3. Therefore, the purge unit 6 may distribute the purge gas in the downward direction DD (the arrow direction) toward the disk 3. The purge unit 6 may be coupled to the lid 4.

The purge unit 6 may distribute the purge gas to a center region CA (illustrated in FIG. 5). The center region CA may be disposed between the processing regions PA1 and PA2. In this case, the purge unit 6 may be disposed at a position spaced apart from the rotational shaft 3b of the disk 3 in the upward direction UD (the arrow direction). The purge unit 6 may distribute the purge gas to the center region CA, and thus, may prevent different kinds of process gases, distributed through the center region CA from the distribution unit 5, from being mixed. When the distribution unit 5 distributes the source gas and the reactant gas, the purge unit 6 may distribute the purge gas to the center region CA so that the source gas and the reactant gas are not mixed through the center region CA. In this case, the purge unit 6 may be disposed between the first distribution mechanism 52 and the second distribution mechanism 53. The purge unit 6 may distribute the purge gas to the center region CA to exhaust a process gas remaining in and around the center region CA. The center region CA may be implemented in a circular shape where a distance from a middle point of a separation space between the first distribution mechanism 52 and the purge unit 6 is a radius.

Referring to FIGS. 2 to 7, the first protrusion portion 7 may be coupled to the disk 3 to protrude in the upward direction UD (the arrow direction) from the disk 3. A portion of the first protrusion portion 7 may be disposed in the center region CA. The other portion of the first protrusion portion 7 may extend from a portion of the first protrusion portion 7 disposed in the center region CA so as to be disposed in a region (hereinafter referred to as a gap region) between the supporting parts 2. In this case, the gap region may be a space which is disposed between the supporting parts 2 as the supporting parts 2 are spaced apart from each other at a certain angle with respect to the rotational shaft 3b of the disk 3. Therefore, the first protrusion portion 7 may be disposed to protrude from the disk 3 in the center region CA and the gap region. Accordingly, the substrate processing apparatus 1 according to the present inventive concept may obtain the following effects.

First, the substrate processing apparatus 1 according to the present inventive concept may be implemented so that a portion of the first protrusion portion 7 protrudes in the upward direction UD (the arrow direction) from the disk 3 in the center region CA, and thus, a size of an empty space in the center region CA may decrease by a volume of the first protrusion portion 7 disposed in the center region CA. Therefore, the substrate processing apparatus 1 according to the present inventive concept may decrease a size of a space which enables a processing gas, including at least one of the process gas distributed by the distribution unit 5 and the purge gas distributed by the purge unit 6, to stay in the center region CA. Therefore, the substrate processing apparatus 1 according to the present inventive concept may decrease a degree of deviation of a process result which occurs between inner portions and the other portions of the substrates S due to the processing gas remaining in the center region CA. Accordingly, the substrate processing apparatus 1 according to the present inventive concept may enhance the uniformity of a processing process performed on a substrate. The inner portions of the substrates S are portions close to the center region CA.

Second, the substrate processing apparatus 1 according to the present inventive concept may be implemented so that the other portion of the first protrusion portion 7 protrudes in the upward direction UD (the arrow direction) from the disk 3 in the gap region, and thus, a size of an empty space in the gap region may decrease by a volume of the first protrusion portion 7 disposed in the gap region. Therefore, the substrate processing apparatus 1 according to the present inventive concept may decrease a size of a space which enables the processing gas to stay in the gap region. Therefore, the substrate processing apparatus 1 according to the present inventive concept may decrease a degree of deviation of a processing rate, such as a deposition rate or an etching rate, which occurs partially in the substrates S due to the processing gas staying in the gap region. Accordingly, the substrate processing apparatus 1 according to the present inventive concept may more enhance the uniformity of a processing process performed on a substrate.

Third, the substrate processing apparatus 1 according to the present inventive concept may decrease a size of an empty space in the center region CA, and thus, may decrease a size of a space to which the purge gas is to be distributed by the purge unit 6, for preventing different kinds of process gases from being mixed through the center region CA. Accordingly, the substrate processing apparatus 1 according to the present inventive concept may reduce the amount of purge gas distributed by the purge unit 6, thereby reducing the operating cost.

Referring to FIGS. 2 to 8, the first protrusion portion 7 may protrude in the upward direction UD (the arrow direction) from the upper surface 3a of the disk 3 at a position spaced apart from the supporting parts 2. Therefore, a gas groove 70 (illustrated in FIG. 8) may be disposed between the first protrusion portion 7 and the supporting parts 2. The gas groove 70 may be a space which is disposed between the first protrusion portion 7 and the supporting parts 2 to contact the upper surface 3a of the disk 3 and may be implemented in a shape such as a valley between the first protrusion portion 7 and the supporting parts 2. A residual gas including at least one of the purge gas distributed by the purge unit 6 and the process gas distributed by the distribution unit 5 may flow along the gas groove 70 and may be exhausted to the outside of the chamber 110.

Therefore, the substrate processing apparatus 1 according to the present inventive concept is implemented to smoothly exhaust a residual gas through the gas groove 70. Also, the substrate processing apparatus 1 according to the present inventive concept is implemented so that the first protrusion portion 7 and the supporting parts 2 protrude in the upward direction UD (the arrow direction) from the upper surface 3a of the disk 3, and thus, by using the first protrusion portion 7 and the supporting parts 2, the residual gas exhausted through the gas groove 70 is prevented from penetrating into the substrate S. In this case, an outer surface, disposed to face the gas groove 70, of each of the first protrusion portion 7 and the supporting parts 2 may function as a barrier which prevents the residual gas from penetrating into the substrate S. Accordingly, the substrate processing apparatus 1 according to the present inventive concept may decrease a degree of deviation of a processing rate, such as a deposition rate or an etching rate, which occurs partially in the substrates S due to the residual gas, thereby more enhancing the uniformity of a processing process performed on a substrate.

The first protrusion portion 7 may protrude by a second height H2 (illustrated in FIG. 3) in the upward direction UD (the arrow direction) from the upper surface 3a of the disk 3. In this case, the supporting parts 2 may support the substrates S so that upper surfaces of the substrates S are spaced apart from each other by the first height H1 (illustrated in FIG. 3) in the upward direction UD (the arrow direction) from the upper surface 3a of the disk 3. The second height H2 and the first height H1 may be implemented identically. That is, an upper surface of the first protrusion portion 7 and the upper surfaces of the substrate S supported by the supporting parts 2 may be disposed at the same position. Therefore, the residual gas exhausted through the gas groove 70 is implemented so that a restraint force (hereinafter referred to as a restraint force of the first protrusion portion 7) for preventing the residual gas exhausted through the gas groove 70 from penetrating into the upper surface of the first protrusion portion 7 is approximately equal to a restraint force (hereinafter referred to as a restraint force of the substrates S) for preventing the residual gas exhausted through the gas groove 70 from penetrating into the upper surfaces of the substrates S supported by the supporting parts 2. This will be described below in detail.

First, when the upper surface of the first protrusion portion 7 has a height which is lower in position than the upper surfaces of the substrates S supported by the supporting parts 2, an outer surface of the first protrusion portion 7 facing the gas groove 70 is implemented to have a height which is lower in position than outer surfaces of the substrates S facing the gas groove 70. Therefore, a distance by which the residual gas exhausted through the gas groove 70 should be raised for penetrating into the upper surface of the first protrusion portion 7 is implemented to be shorter than a distance by which the residual gas exhausted through the gas groove 70 should be raised for penetrating into the upper surfaces of the substrates S supported by the supporting parts 2. That is, the restraint force of the first protrusion portion 7 is implemented to be less than the restraint force of the substrates S. Accordingly, the residual gas exhausted through the gas groove 70 may move to the upper surface of the first protrusion portion 7 which is relatively less in restraint force, and thus, an exhaust force may be reduced.

Next, on the other hand, when the upper surfaces of the substrates S supported by the supporting parts 2 have a height which is lower in position than the upper surface of the first protrusion portion 7, the restraint force of the substrates S is implemented to be less than the restraint force of the first protrusion portion 7. Accordingly, the residual gas exhausted through the gas groove 70 may move to the upper surfaces of the substrates S which is relatively less in restraint force, and thus, an exhaust force may be reduced.

Next, when the upper surfaces of the substrates S supported by the supporting parts 2 have the same height as that of the upper surface of the first protrusion portion 7, the restraint force of the substrates S and the restraint force of the first protrusion portion 7 are implemented to be approximately equal. Therefore, a degree to which the residual gas exhausted through the gas groove 70 concentrates on one of the upper surface of the first protrusion portion 7 and the upper surfaces of the substrates S may be reduced. Accordingly, the substrate processing apparatus 1 according to the present inventive concept may be implemented so that the residual gas does not deviate from the gas groove 70 and is exhausted by smoothly moving along the gas groove 70.

Figure 8:
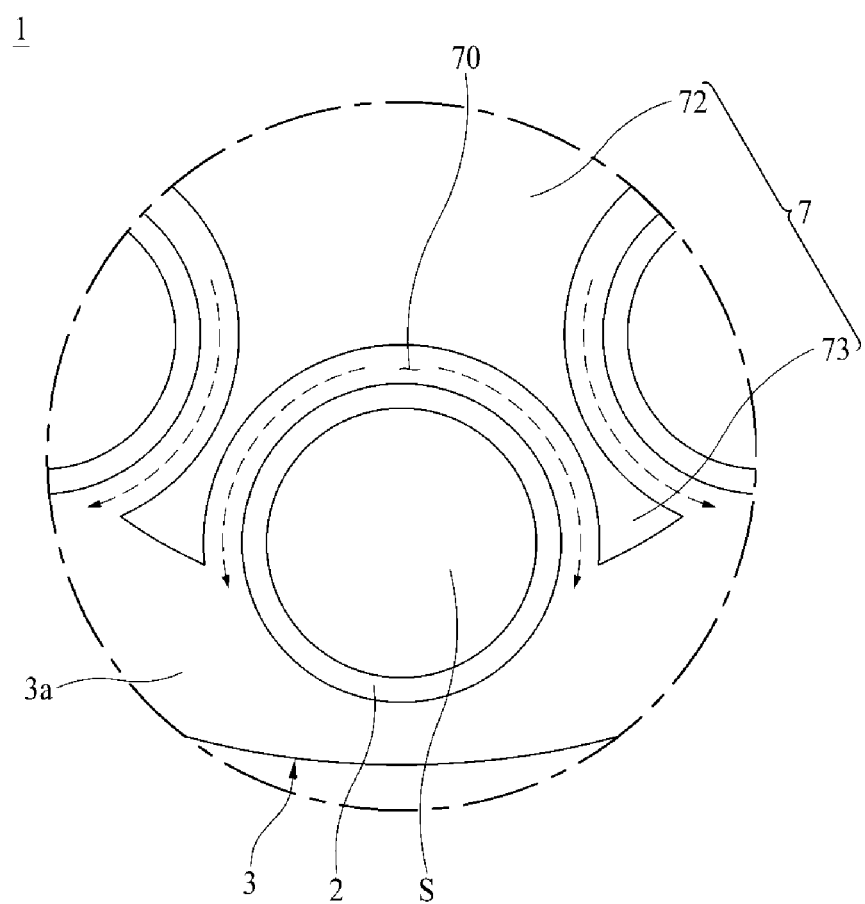
FIG. 8 is a schematic plan view of a portion A of FIG. 7.
Figure 9:
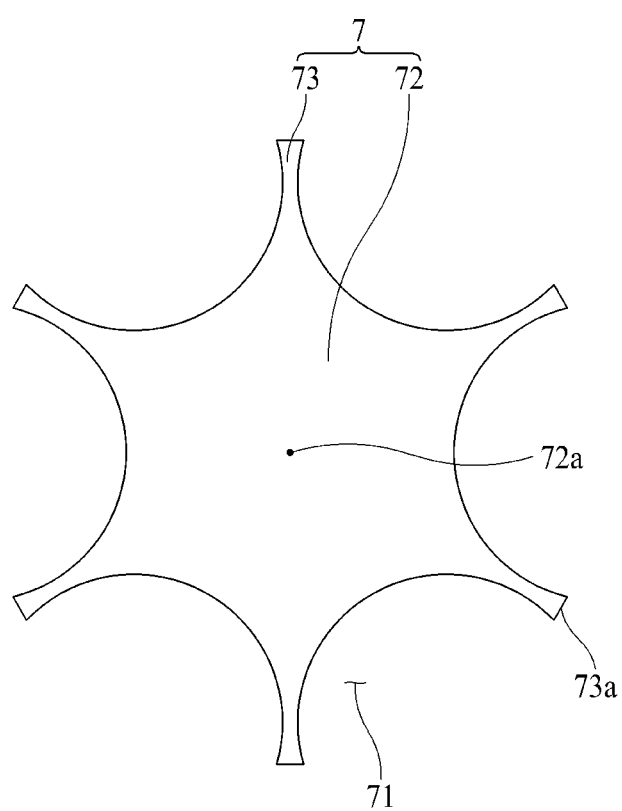
FIG. 9 is a schematic plan view of a first protrusion portion in a substrate processing apparatus according to the present inventive concept.

Referring to FIGS. 8 and 9, the first protrusion portion 7 may include a plurality of accommodating grooves 71 (illustrated in FIG. 9).

Each of the accommodating grooves 71 accommodates a portion of a corresponding supporting part of the supporting parts 2 (illustrated in FIG. 8). Each of the accommodating grooves 71 may be formed to be concave along a shape of the supporting part 2. Therefore, the substrate processing apparatus 1 according to the present inventive concept may be implemented so that the first protrusion portion and each of the supporting parts 2 are disposed apart from each other by a uniform interval. That is, the gas groove 70 may be formed so that cross-sectional surfaces having a uniform size are arranged along a shape of the supporting part 2. Accordingly, the substrate processing apparatus 1 according to the present inventive concept may decrease a possibility that the residual gas exhausted through the gas groove 70 disposed between the first protrusion portion 7 and each of the supporting parts 2 stays.

Outer surfaces of the first protrusion portion 7 which are disposed to face the accommodating grooves 71 and outer surfaces of the supporting parts 2 which are disposed to face the accommodating grooves 71 may be formed to each configure a curve surface. In the supporting parts 2, with respect to a direction toward the first protrusion portion 7, the outer surfaces of the first protrusion portion 7 may be formed as a concavely curve surface, and the outer surfaces of the supporting parts 2 may be formed as a convexly curve surface. Therefore, the outer surfaces of the first protrusion portion 7 and the outer surfaces of the supporting parts 2 may induce the residual gas located in the gas groove 70 to be smoothly exhausted. For example, as illustrated by a dotted-line arrow in FIG. 8, the residual gas located in the gas groove 70 may flow along a curve surface configured by the outer surfaces of the first protrusion portion 7 and the outer surfaces of the supporting parts 2, and thus, may be smoothly exhausted. In FIG. 9, six accommodating grooves 71 are illustrated as being formed in the first protrusion portion 7 but are not limited thereto, and two, three, four, five, or seven or more accommodating grooves 71 may be formed in the first protrusion portion 7. In this case, the number of the accommodating grooves 71 and the number of the supporting parts 2 may be implemented equally.

Figure 10:
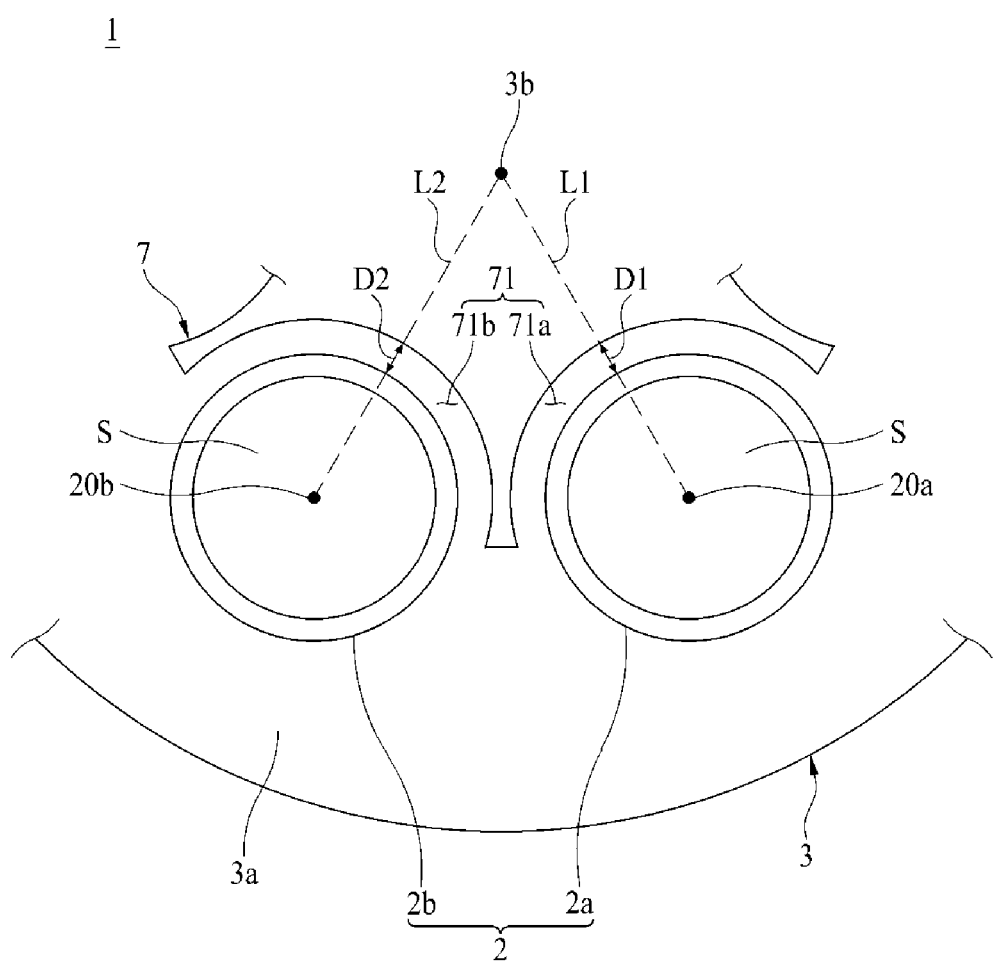
FIGS. 10 and 11 are schematic partial plan views for describing an interval by which a first protrusion portion is spaced apart from supporting parts in a substrate processing apparatus according to the present inventive concept.
Figure 11:
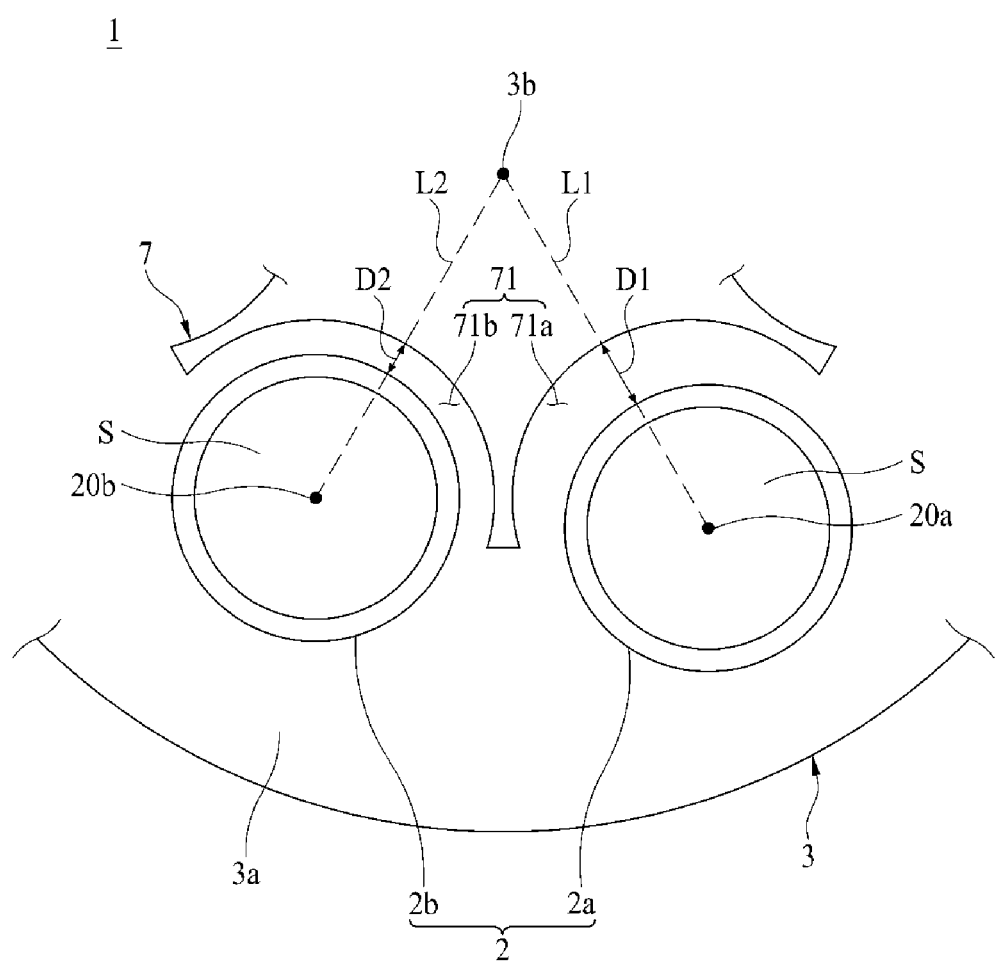

Referring to FIGS. 10 and 11, the first protrusion portion 7 may include a first accommodating groove 71*a* and a second accommodating groove 71*b*.

The first accommodating groove 71*a* accommodates a portion of a first supporting part 2*a*. The first accommodating groove 71*a* may correspond to one of the accommodating grooves 71 included in the first protrusion portion 7. The first supporting part 2*a* may correspond to one of the supporting parts 2 coupled to the disk 3. The first supporting part 2*a* accommodated into the first accommodating groove 71*a* and the first protrusion portion 7 may be disposed apart from each other by a first interval D1. The first interval D1 may denote a distance by which an outer surface of the first supporting part 2*a* disposed to face the first accommodating groove 71*a* and an outer surface of the first protrusion portion 7 disposed to face the first accommodating groove 71*a* are spaced apart from each other. The first interval D1 may denote a distance with respect to a first connection line L1 which connects the rotational shaft 3*b* of the disk 3 to a center 20*a* of the first supporting part 2*a*. The first supporting part 2*a* and the first protrusion portion 7 may be disposed to be uniformly spaced apart from each other by the first interval D1.

The second accommodating groove 71*b* accommodates a portion of a second supporting part 2*b*. The second accommodating groove 71*b* may correspond to one of the accommodating grooves 71 included in the first protrusion portion 7. The second supporting part 2*b* may correspond to one of the supporting parts 2 coupled to the disk 3. The second supporting part 2*b* accommodated into the second accommodating groove 71*b* and the first protrusion portion 7 may be disposed apart from each other by a second interval D2. The second interval D2 may denote a distance by which an outer surface of the second supporting part 2*b* disposed to face the second accommodating groove 71*b* and an outer surface of the first protrusion portion 7 disposed to face the second accommodating groove 71*b* are spaced apart from each other. The second interval D2 may denote a distance with respect to a second connection line L2 which connects the rotational shaft 3*b* of the disk 3 to a center 20*b* of the second supporting part 2*b*. The second supporting part 2*b* and the first protrusion portion 7 may be disposed to be uniformly spaced apart from each other by the second interval D2.

As illustrated in FIG. 10, the second interval D2 and the first interval D1 may be implemented identically. In this case, the second supporting part 2*b* and the first supporting part 2*a* may be disposed at positions spaced apart from the first protrusion portion 7 by the same distance. Therefore, the substrate processing apparatus 1 according to the present inventive concept may be implemented so that a processing process is performed in a process environment where a substrate S supported by the second supporting part 2*b* approximately matches a substrate S supported by the first supporting part 2*a*. Although not shown, all of the supporting parts 2 may be disposed at positions spaced apart from the first protrusion portion 7 by the same distance.

As illustrated in FIG. 11, the second interval D2 and the first interval D1 may be implemented differently. In this case, the second supporting part 2b and the first supporting part 2a may be disposed at positions spaced apart from the first protrusion portion 7 by different distances. Therefore, the substrate processing apparatus 1 according to the present inventive concept may be implemented so that a processing process is performed in a process environment where a substrate S supported by the second supporting part 2b differs from a substrate S supported by the first supporting part 2a. When the substrate S supported by the second supporting part 2b and the substrate S supported by the first supporting part 2a have different kinds and different specifications, the substrate processing apparatus 1 according to the present inventive concept may be implemented so that the second interval D2 differs from the first interval D1, thereby enhancing the uniformity of a processing process performed on the substrates S.

For example, the second interval D2 may be implemented to be shorter than the first interval D1. In this case, the second supporting part 2b may be disposed at a position spaced apart from the first protrusion portion 7 by a distance which is shorter than the first supporting part 2a. Although not shown, all of the supporting parts 2 may be disposed at positions spaced apart from the first protrusion portion 7 by different distances. Although not shown, the substrate processing apparatus 1 according to the present inventive concept may be implemented so that the supporting parts 2 spaced apart from the first protrusion portion 7 by different distances match the supporting parts 2 spaced apart from the first protrusion portion 7 by the same distance. Accordingly, the substrate processing apparatus 1 according to the present inventive concept may enhance a general purpose capable of being applied to various substrates, various processing processes, etc.

Figure 12:
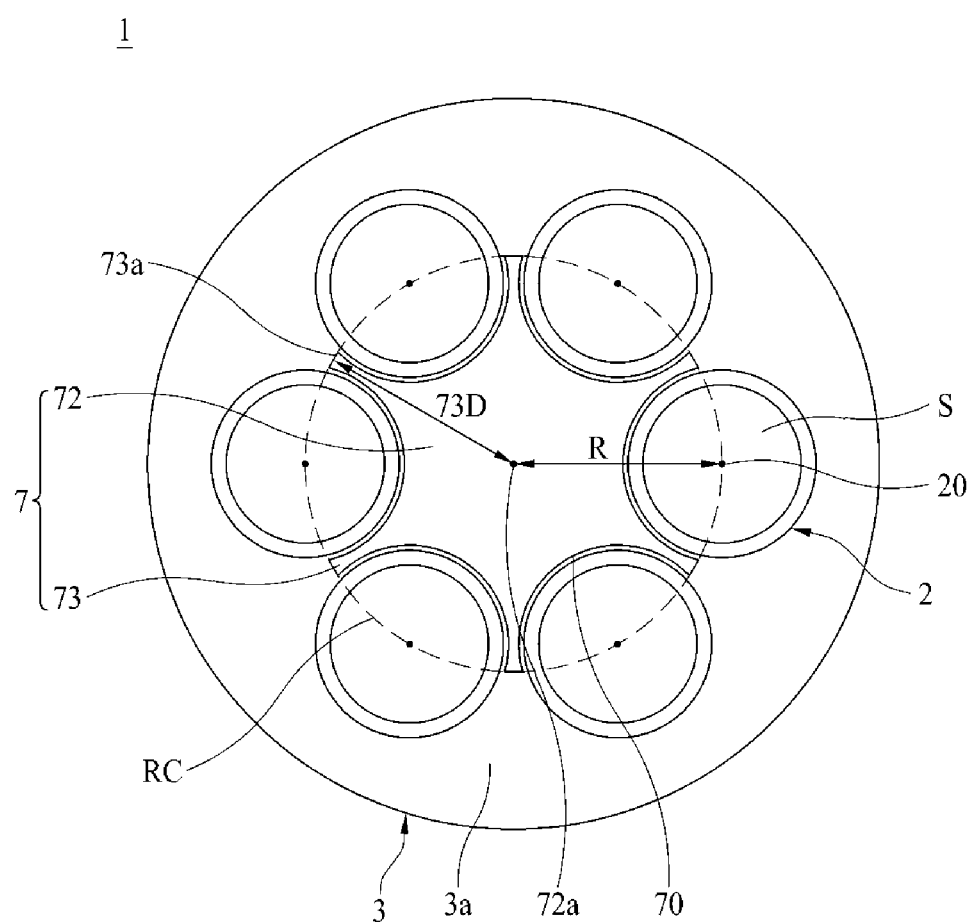
FIGS. 12 to 14 are schematic partial plan views for describing protrusion members of a first protrusion portion in a substrate processing apparatus according to the present inventive concept.
Figure 13:
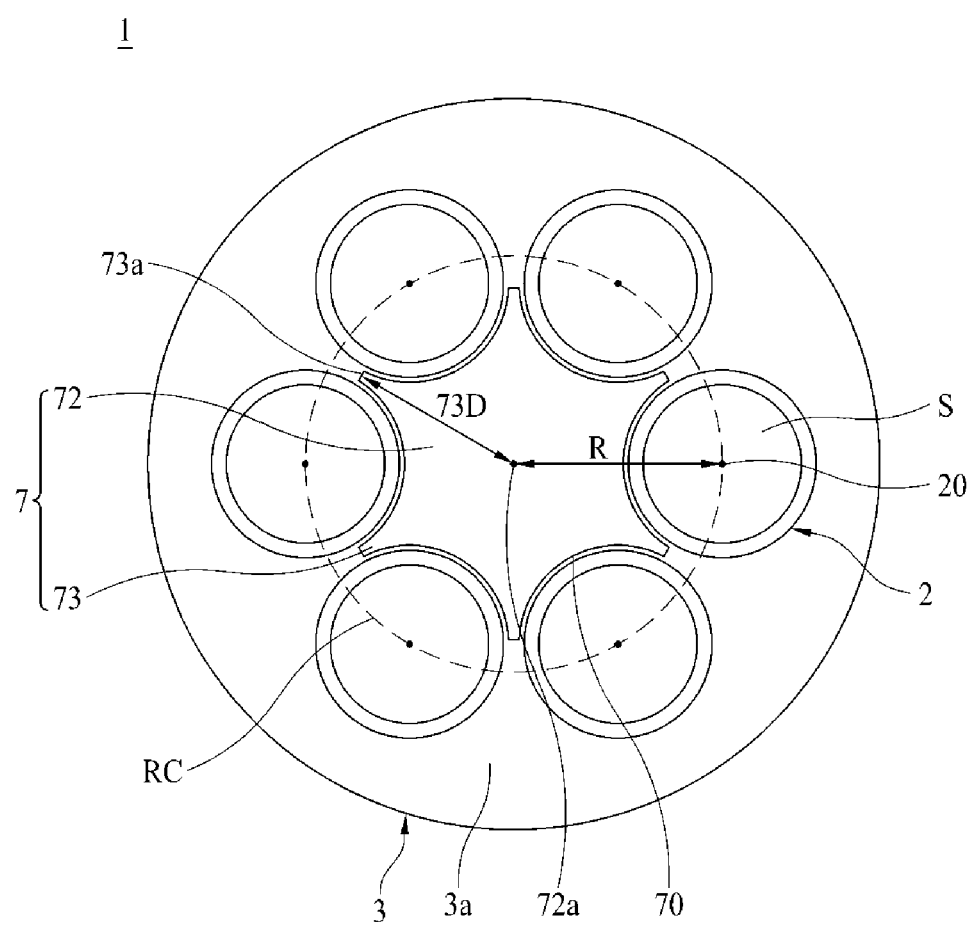
Figure 14:
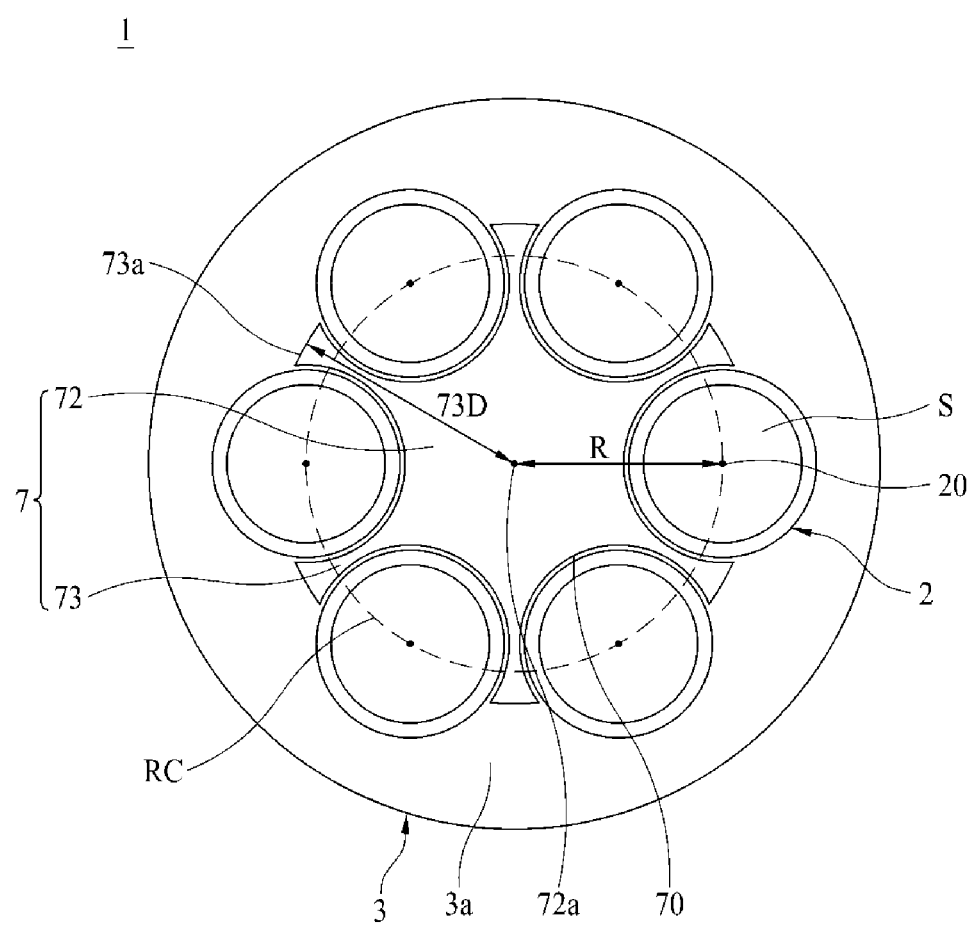
Figure 15:
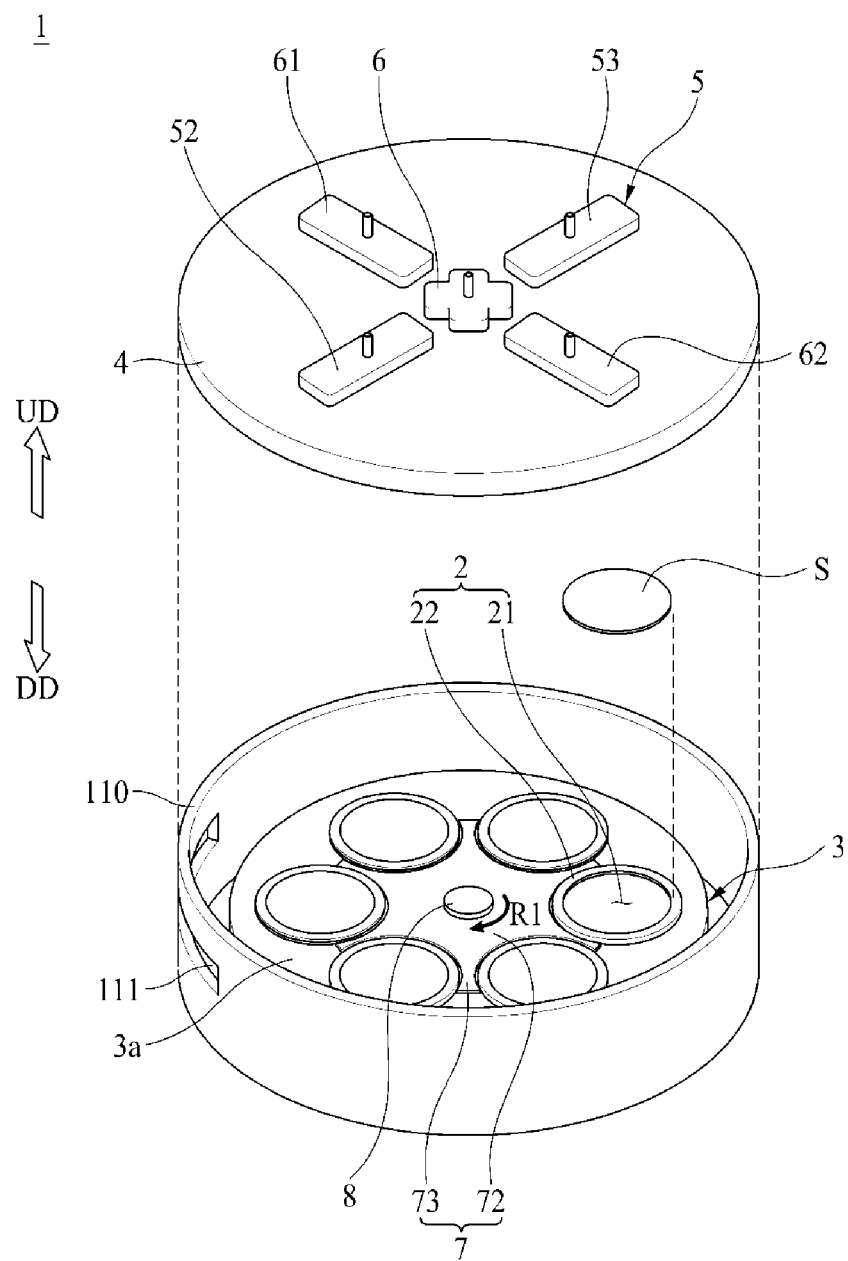
FIG. 15 is a schematic exploded perspective view for describing a second protrusion portion in a substrate processing apparatus according to the present inventive concept.
Figure 16:
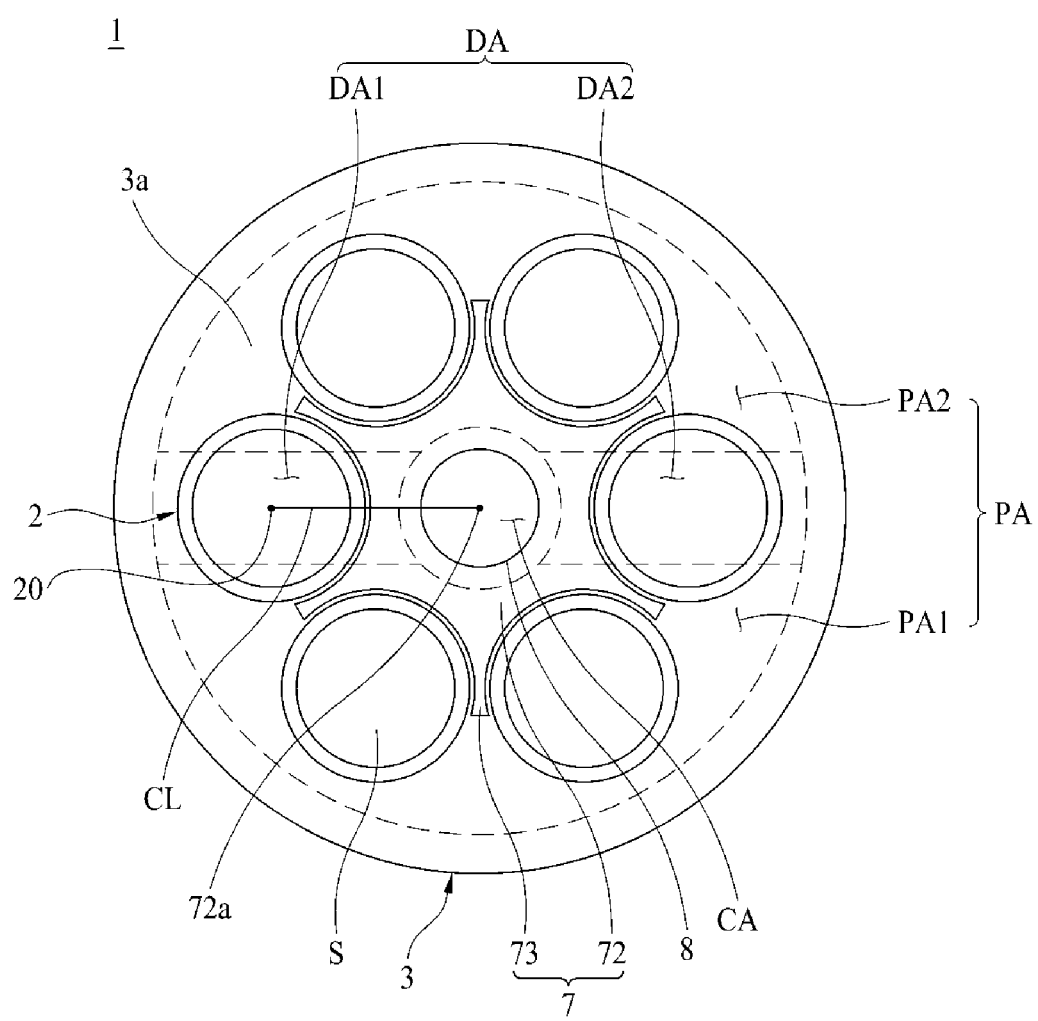
FIG. 16 is a schematic plan view of a supporting part, a disk, a first protrusion portion, and a second protrusion portion in a substrate processing apparatus according to the present inventive concept.

Referring to FIGS. 12 to 14, the first protrusion portion 7 may include a center plate 72 and a plurality of protrusion members 73.

The center plate 72 protrudes in the upward direction UD (the arrow direction) from the center region CA. Therefore, the center plate 72 may decrease a size of an empty space in the center region CA, thereby reducing a size of a space enabling the processing gas to stay in the center region CA. The center plate 72 may configure a portion of the first protrusion portion 7. The center plate 72 may be coupled to the disk 3 to form a concentric circle with the disk 3. In this case, a center 72a of the center plate 72 and the rotational shaft 3b (illustrated in FIG. 11) of the disk 3 may be disposed at the same positions.

The center plate 72 may be disposed apart from the supporting parts 2 by a certain distance. Therefore, the gas grooves 70 may be disposed between the center plate 72 and the supporting parts 2. The center plate 72 and the supporting parts 2 may be implemented to protrude from the upper surface 3a of the disk 3, and thus, may prevent the residual gas exhausted through the gas groove 70 from penetrating into the center region CA and the substrates S supported by the supporting parts 2.

The protrusion members 73 extend in an outward direction from the center plate 72 to a region between the supporting parts 2. Therefore, the protrusion members 73 may be disposed between the supporting parts 2. That is, the protrusion members 73 may be disposed in the gap region. The protrusion members 73 may protrude in the upward direction UD (the arrow direction) in the gap region. Therefore, the protrusion members 73 may decrease a size of an empty space in the gap region, thereby reducing a size of a space enabling the processing gas to stay in the gap region. The protrusion members 73 may configure a portion of the first protrusion portion 7. The protrusion members 73 may be coupled to the center plate 72. The protrusion members 73 and the first protrusion portion 7 may be provided as one body.

The protrusion members 73 may be disposed apart from the supporting parts 2 by a certain distance in the gap region. Therefore, the gas grooves 70 may be disposed between the protrusion members 73 and the supporting parts 2. The protrusion members 73 and the supporting parts 2 may be implemented to protrude from the upper surface 3a of the disk 3, and thus, the residual gas exhausted through the gas groove 70 may prevent from penetrating into upper portions of the protrusion members 73 and the substrates S supported by the supporting parts 2.

In FIGS. 12 to 14, six protrusion members 73 are illustrated as being coupled to the center plate 72 but are not limited thereto, and two, three, four, five, or seven or more protrusion members 73 may be coupled to the center plate 72. In this case, the number of the protrusion members 73 and the number of the supporting parts 2 may be implemented equally.

As illustrated in FIG. 12, each of the protrusion members 73 may be provided so that an end portion 73a thereof is disposed in a rotational radius R. In this case, with respect to the center 72a of the center plate 72, a length 73D of the protrusion member 73 and the rotational radius R may be implemented equally. The end portion 73a of each of the protrusion members 73 is a portion which is spaced apart from the center 72a of the center plate 72 by a longest distance in the outward direction. The rotational radius R denotes a distance by which the center 20 of each of the supporting parts 2 is spaced apart from the center 72a of the center plate 72. In this case, the supporting parts 2 may be coupled to the disk 3 so that the center 20 of each of the supporting parts 2 is spaced apart from the center 72a of the center plate 72 by the rotational radius R. The end portions 73a of the protrusion members 73 may be disposed in a virtual radius circle RC which connects the centers 20 of the supporting parts 2 with respect to the center 72a of the center plate 72.

As illustrated in FIG. 13, the protrusion members 73 may be provided so that the end portions 73a thereof are disposed in the rotational radius R. In this case, with respect to the center 72a of the center plate 72, the length 73D of the protrusion member 73 may be implemented to be shorter than the rotational radius R. Therefore, with respect to the center 72a of the center plate 72, the end portions 73a of the protrusion members 73 may be disposed in the virtual radius circle RC which connects the centers 20 of the supporting parts 2. In this case, the protrusion members 73 may be provided so that the end portions 73a thereof are disposed at a distance which is 0.9 or more times the rotational radius R. Therefore, with respect to the center 72a of the center plate 72, the length 73D of the protrusion member 73 may be implemented to be 0.9 or more times the rotational radius R.

As illustrated in FIG. 14, the protrusion members 73 may be provided so that the end portions 73a thereof are disposed outside the rotational radius R. In this case, with respect to the center 72a of the center plate 72, the length 73D of the protrusion member 73 may be implemented to be longer than the rotational radius R. Therefore, with respect to the center 72a of the center plate 72, the end portions 73a of the protrusion members 73 may be disposed outside the virtual radius circle RC which connects the centers 20 of the supporting parts 2. In this case, the protrusion members 73 may be provided so that the end portions 73a thereof are disposed at a distance which is 1.1 or less times the rotational radius R. Therefore, with respect to the center 72a of the center plate 72, the length 73D of the protrusion member 73 may be implemented to be 1.1 or less times the rotational radius R.

As illustrated in FIGS. 12 to 14, the protrusion members 73 may be provided so that the end portions 73a thereof are disposed at a distance which is 0.9 to 1.1 times the rotational radius R. In this case, with respect to the center 72a of the center plate 72, the length 73D of the protrusion member 73 may be implemented to be 0.9 to 1.1 times the rotational radius R.

The protrusion members 73, the center plate 72, and the disk 3 may be formed of the same material. The protrusion members 73 and the center plate 72 may be formed of the same material, and the disk 3 and the center plate 72 may be formed of different materials.

Referring to FIGS. 2 to 17, the substrate processing apparatus 1 according to the present inventive concept may include a second protrusion portion 8.

The second protrusion portion 8 protrudes from the first protrusion portion 7. The second protrusion portion 8 may protrude from the upper surface of the first protrusion portion 7 in the upward direction UD (the arrow direction) in the center region CA. Accordingly, the substrate processing apparatus 1 according to the present inventive concept may obtain the follow effects.

First, the substrate processing apparatus 1 according to the present inventive concept is implemented so that the first protrusion portion 7 protrudes in the upward direction UD (the arrow direction) from the upper surface of the disk 3, and additionally, the second protrusion portion 8 protrudes in the upward direction UD (the arrow direction) from the upper surface of the first protrusion portion 7. Therefore, in the substrate processing apparatus 1 according to the present inventive concept, a size of an empty space in the center region CA may decrease by a volume corresponding to a sum of a volume of the first protrusion portion 7 and a volume of the second protrusion portion 8. Accordingly, in the substrate processing apparatus 1 according to the present inventive concept, a size of a space enabling the processing gas to stay in the center region CA may be further reduced, thereby more enhancing the uniformity of a processing process performed on a substrate.

Second, in the substrate processing apparatus 1 according to the present inventive concept, a size of an empty space in the center region CA may be further reduced by using the first protrusion portion 7 and the second protrusion portion 8, and thus a size of a space to which the purge gas is to be distributed by the purge unit 6, for preventing different kinds of process gases from being mixed through the center region CA. Accordingly, the substrate processing apparatus 1 according to the present inventive concept may more reduce the amount of purge gas distributed by the purge unit 6, thereby reducing the operating cost.

Third, in a comparative example where the second protrusion portion 8 protrudes from the lid 4, a size of an empty space in the center region CA may be reduced. However, in the comparative example, a communication space which communicates the processing regions PA1 and PA2 is disposed as the second protrusion portion 8 and the first protrusion portion 7 are spaced apart from each other in a direction in which the distribution unit 5 downward distributes a process gas. Therefore, in the comparative example, a distributive force with which the distribution unit 5 downward distributes the process gas acts as a force for passing through the communication space, and thus, there is a risk where different kinds of process gases are mixed through the communication space. In order to prevent the risk, the amount of purge gas distributed by the purge unit 6 should increase.

On the other hand, the substrate processing apparatus 1 according to the present inventive concept is implemented so that the second protrusion portion 8 protrudes in the upward direction UD (the arrow direction) from the first protrusion portion 7, and thus, a communication space like the comparative example is not provided in the direction in which the distribution unit 5 downward distributes the process gas. Therefore, comparing with the comparative example, the substrate processing apparatus 1 according to the present inventive concept may use the second protrusion portion 8 to decrease a risk where different kinds of process gases are mixed, and moreover, may prevent mixing of different kinds of process gases with a relatively low amount of distributed purge gas. Also, in the substrate processing apparatus 1 according to the present inventive concept, the distributive force with which the distribution unit 5 downward distributes the process gas acts as a force which returns the process gas to an outer portion of the center region CA. This is because a distributive force remaining after the process gas is blocked by the second protrusion portion 8 act as a force which returns the process gas to the outer portion of the center region CA. Accordingly, the substrate processing apparatus 1 according to the present inventive concept may use the distributive force, with which the distribution unit 5 downward distributes the process gas, as a preventive force which prevents the process gas from staying in the center region CA.

The second protrusion portion 8 may be provided in a cylindrical shape which protrudes in the upward direction UD (the arrow direction) from the first protrusion portion 7 in the center region CA, but is not limited thereto and may be provided in an arbitrary shape for decreasing a size of an empty space in the center region CA. The second protrusion portion 8 and the first protrusion portion 7 may be provided as one body.

The second protrusion portion 8 may be formed of an insulating material. Therefore, in the substrate processing apparatus 1 according to the present inventive concept, in a case where a deposition process is performed on the substrates S, a thin film may be prevented from being unnecessarily deposited on the second protrusion portion 8. Therefore, in the substrate processing apparatus 1 according to the present inventive concept, the quality of a substrate S on which the deposition process is completed may be prevented from being degraded due to the thin film deposited on the second protrusion portion 8, and moreover, a cleaning period of the second protrusion portion 8 may increase. For example, the second protrusion portion 8 may be formed of ceramic.

The second protrusion portion 8 and the disk 3 may be formed of different materials. That is, the second protrusion portion 8 and the disk 3 may be formed of different kinds of materials. For example, when the disk 3 is formed of a conductive material, the second protrusion portion 8 may be formed of an insulating material. In this case, the disk 3 may be formed of aluminum (Al), and the second protrusion portion 8 may be formed of ceramic. Therefore, in a case where a deposition process is performed on the substrates S, the substrate processing apparatus 1 according to the present inventive concept may induce a thin film to be deposited on a substrate S supported by the disk 3 and simultaneously may prevent a thin film from being unnecessarily deposited on the second protrusion portion 8. The second protrusion portion 8 and the first protrusion portion 7 may be formed of the same material.

The second protrusion portion 8 may be detachably coupled to the first protrusion portion 7. Therefore, in the substrate processing apparatus 1 according to the present inventive concept, in a case where a process condition such as a size of the substrate S or the kind of the processing process is changed and thus it is required to adjust a size of an empty space in the center region CA, a responding force corresponding to a changed process condition may be enhanced by replacing the second protrusion portion 8. For example, the second protrusion portion 8 may be detachably coupled to the first protrusion portion 7 by using a fastening means such as a bolt.

When the second protrusion portion 8 is disposed in the center region CA, the purge unit 6 may be coupled to the lid 4 so as to be disposed in the upward direction UD (the arrow direction) with respect to the second protrusion portion 8. Therefore, the purge unit 6 may downward distribute the purge gas toward the second protrusion portion 8. The purge gas downward distributed toward the second protrusion portion 8 by the purge unit 6 may prevent mixing of different kinds of process gases while staying in a space disposed between the purge unit 6 and the second protrusion portion 8. Also, the purge gas downward distributed toward the second protrusion portion 8 by the purge unit 6 may be induced to move to the first protrusion portion 7 along an outer surface of the second protrusion portion 8. Accordingly, the substrate processing apparatus 1 according to the present inventive concept may exhaust a process gas remaining in the center region CA by using the purge gas which has moved to the first protrusion portion 7.

The second protrusion portion 8 may protrude in the upward direction UD (the arrow direction) from the first protrusion portion 7 so that an upper end 80 (illustrated in FIG. 17) thereof is disposed at a position which is higher than a lower end 510 of the distribution hole 51. That is, a height 8H (illustrated in FIG. 17) of the upper end 80 of the second protrusion portion 8 is higher than a height 510H (illustrated in FIG. 17) of the lower end 510 of the distribution hole 51. Therefore, the substrate processing apparatus 1 according to the present inventive concept is implemented so that the distribution unit 5 downward distributes a process gas at a height which is lower in position than the upper end 80 of the second protrusion portion 8. Therefore, the process gas distributed by the distribution unit 5 may be raised in a reverse direction of a direction in which gravity acts, and thus, may pass through the second protrusion portion 8. Accordingly, the substrate processing apparatus 1 according to the present inventive concept may more enhance a preventive force which prevents mixing of different process gases.

Referring to FIGS. 2 to 18, the second protrusion portion 8 may protrude in the upward direction UD (the arrow direction) from an upper surface of the center plate 72. The second protrusion portion 8 may be provided to have a size which is less than that of the center plate 72. Therefore, the second protrusion portion 8 may be disposed inward from the center plate 72. In this case, the center plate 72 may be disposed in a shape which protrudes from the second protrusion portion 8 to the outside.

The second protrusion portion 8 may be disposed at a position spaced apart from the supporting parts 2. In this case, the center plate 72 may be provided to protrude by a first distance FD (illustrated in FIG. 18) from the second protrusion portion 8 with respect to a virtual center connection line CL (illustrated in FIG. 8) which connects a center 72a (illustrated in FIG. 16) of the center plate 72 to a center 20 (illustrated in FIG. 16) of each of the supporting parts 2. Each of the supporting parts 2 may be disposed apart from the center plate 72 by a second distance SD (illustrated in FIG. 18) with respect to the center connection line CL. The second distance SD may be implemented to be equal to or shorter than the first distance FD. That is, the first distance FD is not implemented to be shorter than the second distance SD. Accordingly, the substrate processing apparatus 1 according to the present inventive concept may decrease a degree of deviation of a processing rate, such as a deposition rate or an etching rate, which occurs partially in the substrates S due to the purge gas distributed by the purge unit 6. This will be described below in detail.

First, in the comparative example where the first distance FD is implemented to be shorter than the second distance SD, a distance by which the center plate 72 protrudes from the second protrusion portion 8 to the outside is implemented to be shorter than a distance by which the center plate 72 is spaced apart from the supporting parts 2. In a process where the purge gas distributed by the purge unit 6 flows to the supporting parts 2 via the second protrusion portion 8 and the center plate 72, a distance by which the purge gas flows along the center plate 72 is shortened. Therefore, an elbow period TD (illustrated in FIG. 18) where a flow direction is changed is almost removed so that the purge gas distributed by the purge unit 6 flows along the outer surface of the second protrusion portion 8 and then flows along the upper surface of the center plate 72, and thus, the purge gas distributed by the purge unit 6 may easily penetrate into the substrates S supported by the supporting parts 2 by using a distributive force distributed to the second protrusion portion 8. Accordingly, in the comparative example, a deviation of a processing rate, such as a deposition rate or an etching rate, occurs partially in the substrates S due to the purge gas distributed by the purge unit 6.

On the other hand, in an embodiment where the first distance FD is implemented to be equal to or longer than the second distance SD, a distance by which the center plate 72 protrudes from the second protrusion portion 8 to the outside is implemented to be equal to a distance by which the center plate 72 is spaced apart from the supporting parts 2. In an embodiment, the distance by which the center plate 72 protrudes from the second protrusion portion 8 to the outside is implemented to be longer than the distance by which the center plate 72 is spaced apart from the supporting parts 2. Therefore, in an embodiment, an elbow period TD where a flow direction is changed is more clearly formed than the comparative example so that the purge gas distributed by the purge unit 6 flows along the outer surface of the second protrusion portion 8 and then flows along the upper surface of the center plate 72. Therefore, a distributive force with which the purge unit 6 distributes the purge gas to the second protrusion portion 8 is reduced while passing through the elbow period TD, and thus, the purge gas distributed by the purge unit 6 is difficult to penetrate into the substrates S supported by the supporting parts 2. Accordingly, an embodiment may decrease a degree of deviation of a processing rate, such as a deposition rate or an etching rate, which occurs partially in the substrates S due to the purge gas distributed by the purge unit 6. In an embodiment, the second protrusion portion 8 may be provided to have a size which is less than that of the center plate 72, and thus, the first distance FD may be implemented to be equal to or longer than the second distance SD. In this case, a diameter of the second protrusion portion 8 may be implemented to be less than that of the center plate 72.

In a case where the second protrusion portion 8 is provided, an insertion groove 41 (illustrated in FIG. 17) may be formed in the lid 4.

The second protrusion portion 8 may be inserted into the insertion groove 41. Therefore, the substrate processing apparatus 1 according to the present inventive concept may prevent a separated distance between the supporting parts 2 and the distribution unit 5 from increasing due to a height of the second protrusion portion 8 and may decrease a degree to which a total size increases in a height direction. Also, the substrate processing apparatus 1 according to the present inventive concept may increase a height of the second protrusion portion 8, and thus, may increase a distance which should increase in order for a process gas distributed by the distribution unit 5 to pass through the second protrusion portion 8. Therefore, the substrate processing apparatus 1 according to the present inventive concept may more reinforce a preventive force which prevents mixing of different kinds of process gases. The second protrusion portion 8 may be inserted into the insertion groove 41 so that the upper end 80 thereof is disposed at a position which is higher than the lower end 510 of the distribution hole 51.

The purge unit 6 may be disposed in the insertion groove 41. The purge unit 6 may be coupled to the lid 4 so as to be disposed in the insertion groove 41 in the upward direction UD (the arrow direction) with respect to the second protrusion portion 8. In this case, the purge unit 6 may distribute the purge gas to the insertion groove 41 in the upward direction UD (the arrow direction) with respect to the second protrusion portion 8.

The insertion groove 41 may be formed in a wholly cylindrical shape, but is not limited thereto and may be formed in an arbitrary shape into which the second protrusion portion 8 is capable of being inserted.

In a case where the insertion groove 41 is formed in the lid 4, the second protrusion portion 8 may be provided to have a size which is less than that of the insertion groove 41, so as to be spaced apart from an inner wall 42 (illustrated in FIG. 17) of the lid 4 where the insertion groove 41 is provided. Therefore, the purge unit 6 may distribute the purge gas to a region between the inner wall 42 of the lid 4 and the second protrusion portion 8. That is, a region between the second protrusion portion 8 and the inner wall 42 of the lid 4 may be used as a path through which the purge gas passes. Therefore, the substrate processing apparatus 1 according to the present inventive concept may be implemented so that the purge gas distributed by the purge unit 6 moves to the first protrusion portion 7 through the region between the second protrusion portion 8 and the inner wall 42 of the lid 4. Therefore, the substrate processing apparatus 1 according to the present inventive concept may exhaust a process gas remaining in the center region CA by using the purge gas which has moved to the first protrusion portion 7. Also, the purge gas distributed by the purge unit 6 downward move to the first protrusion portion 7, and thus, the substrate processing apparatus 1 according to the present inventive concept may prevent the process gas distributed by the distribution unit 5 from being raised along the second protrusion portion 8.

Figure 17:
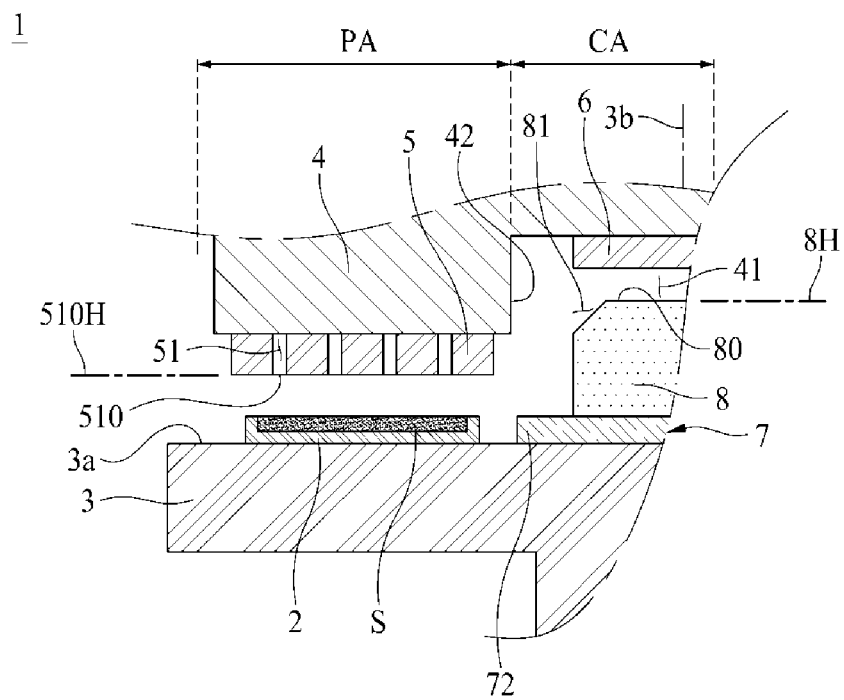
FIGS. 17 and 18 are schematic side cross-sectional views of a supporting part, a disk, a first protrusion portion, and a second protrusion portion each taken along line I-I of FIG. 2 in a substrate processing apparatus according to the present inventive concept.
Figure 18:
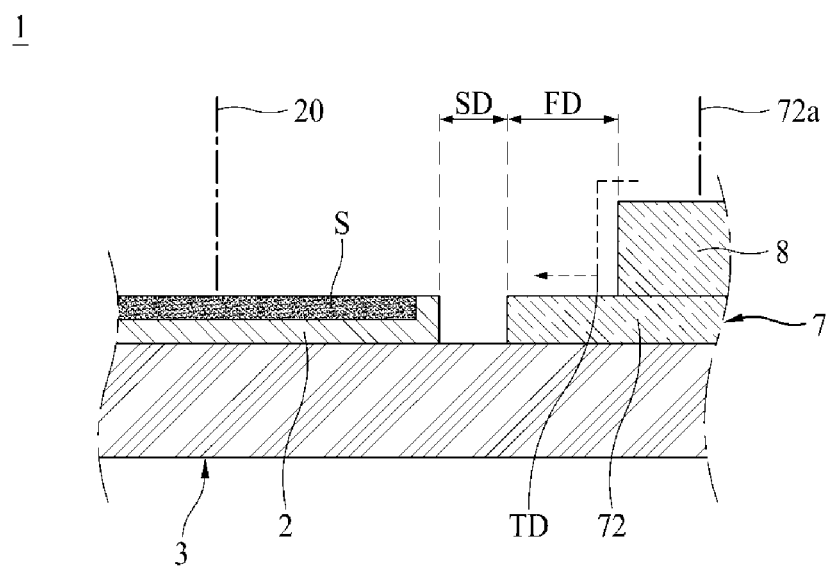

In a case where the insertion groove 41 is formed in the lid 4, the second protrusion portion 8 may include an induction groove 81 (illustrated in FIG. 17).

The induction groove 81 induces a turbulent flow of the purge gas to be formed in the insertion groove 41. The turbulent flow of the purge gas formed in the insertion groove 41 by the induction groove 81 may prevent the process gas from flowing into the region between the inner wall 42 of the lid 4 and the second protrusion portion 8. Accordingly, the substrate processing apparatus 1 according to the present inventive concept may more increase a preventive force which prevents mixing of different process gases by using the induction groove 81.

The induction groove 81 may be implemented as a groove which is formed to have a certain depth in the outer surface of the second protrusion portion 8. The induction groove 81 may be formed in a corner portion located in the upper end 80 of the second protrusion portion 8. A distance by which a portion, where the induction groove 81 is provided, is spaced apart from the inner wall 42 of the lid 4 may be implemented to be greater than a distance by which another portion of the second protrusion portion 8 is spaced apart from the inner wall 42 of the lid 4.

Referring to FIGS. 2 to 18, the substrate processing apparatus 1 according to the present inventive concept may include a first division mechanism 61 and a second division mechanism 62.

The first division mechanism 61 distributes the purge gas. The first division mechanism 61 may be coupled to the lid 4 so as to be disposed on the disk 3. The first division mechanism 61 may distribute the purge gas to a first division region DA1 (illustrated in FIG. 16). The first division region DA1 may be disposed between the first processing region PA1 and the second processing region PA2 along the rotational path. The first division region DA1 may be disposed in one side of the purge unit 6. Therefore, the first division mechanism 61 may distribute the purge gas to the first division region DA1, and thus, may spatially divide the first processing region PA1 and the second processing region PA2 in the one side of the purge unit 6. Therefore, the first division mechanism 61 may prevent different kinds of process gases from being mixed through the first division region DA1.

The second division mechanism 62 distributes the purge gas. The second division mechanism 62 may be coupled to the lid 4 so as to be disposed on the disk 3. The second division mechanism 62 may distribute the purge gas to a second division region DA2 (illustrated in FIG. 16). The second division region DA2 may be disposed between the first processing region PA1 and the second processing region PA2 along the rotational path. The second division region DA2 may be disposed in the other side of the purge unit 6. Therefore, the second division mechanism 62 may distribute the purge gas to the second division region DA2, and thus, may spatially divide the first processing region PA1 and the second processing region PA2 in the other side of the purge unit 6. Therefore, the second division mechanism 62 may prevent different kinds of process gases from being mixed through the second division region DA2.

Figure 19:
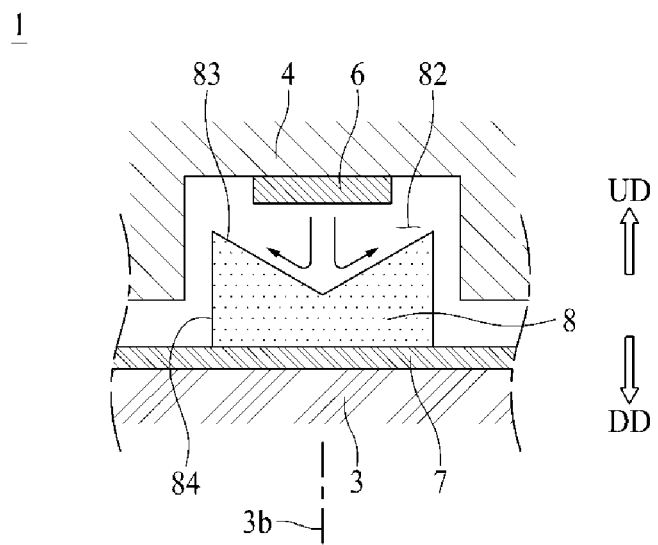
FIG. 19 is a schematic side cross-sectional view of a second protrusion portion taken along line I-I of FIG. 2 in a substrate processing apparatus according to a modified embodiment of the present inventive concept.

Referring to FIGS. 2 to 19, a second protrusion portion 8 according to a modified embodiment of the present inventive concept may include a dispersion groove 82 (illustrated in FIG. 19)

The dispersion groove 82 disperses the purge gas distributed by the purge unit 6. The dispersion groove 82 may be provided in the upper surface 83 (illustrated in FIG. 19) of the second protrusion portion 8. The upper surface 83 of the second protrusion portion 8 is a surface of the second protrusion portion 8 which is disposed to face the purge unit 6. Therefore, the dispersion groove 82 may increase a distance by which the upper surface 83 of the second protrusion portion 8 is spaced apart from the purge unit 6. Accordingly, by using the dispersion groove 82, the substrate processing apparatus 1 according to the present inventive concept may prevent the purge gas distributed by the purge unit 6 from flowing backward to the purge unit 6 when the purge gas distributed by the purge unit 6 is blocked by the upper surface 83 of the second protrusion portion 8. This will be described below in detail.

First, when the upper surface 83 of the second protrusion portion 8 is provided as a flat surface without the dispersion groove 82, the distance by which the upper surface 83 of the second protrusion portion 8 is spaced apart from the purge unit 6 may be implemented to be narrow, and thus, the purge gas distributed by the purge unit 6 may stay without being dispersed to the outside because the purge gas is blocked by the upper surface 83 of the second protrusion portion 8. In this state, when the purge unit 6 continuously distributes the purge gas, there is a risk where the purge gas is blocked by the upper surface 83 of the second protrusion portion 8 and flows backward to the purge unit 6.

Next, when the dispersion groove 82 is formed in the upper surface 83 of the second protrusion portion 8, the dispersion groove 82 may increase the distance by which the upper surface 83 of the second protrusion portion 8 is spaced apart from the purge unit 6. Therefore, the second protrusion portion 8 is implemented to have a sufficient space which enables the purge gas distributed by the purge unit 6 to be smoothly dispersed through the dispersion groove 82. Therefore, by using the dispersion groove 82, the substrate processing apparatus 1 according to the present inventive concept may prevent the purge gas distributed by the purge unit 6 from flowing backward to the purge unit 6, and thus, may reinforce a preventive force which prevents mixing of different kinds of reactant gases and an exhaustive force which exhausts a process gas.

Due to the dispersion groove 82, the second protrusion portion 8 may be implemented so that the distance by which the upper surface 83 of the second protrusion portion 8 is spaced apart from the purge unit 6 without any change in height of a prevention surface 84 (illustrated in FIG. 19). The prevention surface 84 is a surface of the second protrusion portion 8 facing the processing region PA, for decreasing a size of an empty space in the center region CA. When the second protrusion portion 8 is provided in a cylindrical shape, the prevention surface 84 may correspond to a side surface of the second protrusion portion 8.

The dispersion groove 82 may be formed so that a size is reduced as the dispersion groove 82 extends in a downward direction DD (an arrow direction). The downward direction DD (the arrow direction) is a direction from the purge unit 6 to the second protrusion portion 8. Therefore, the dispersion groove 82 may be provided so that a portion corresponding to a purge gas distribution region to which the purge unit 6 distributes the purge gas is formed to have a deeper depth and a depth become shallower as the dispersion groove 82 extends to the outside toward the prevention surface 84. Therefore, the dispersion groove 82 may further increase the distance, by which the upper surface 83 of the second protrusion portion 8 is spaced apart from the purge unit 6, in the purge gas distribution region. When the second protrusion portion 8 is provided in a cylindrical shape, the purge gas distribution region may be provided to have a diameter which is less than that of the second protrusion portion 8.

The dispersion groove 82 may be formed so that a size is reduced as the dispersion groove 82 extends in the downward direction DD (the arrow direction), and thus, the upper surface 83 of the second protrusion portion 8 may be provided to be inclined so that a height thereof is lowered as the upper surface 83 extends from the prevention surface 84 to an inner portion. That is, the upper surface 83 of the second protrusion portion 8 may be provided to be inclined so that a height thereof is lowered as the upper surface 83 extends to the outside toward the prevention surface 84. Accordingly, the upper surface 83 of the second protrusion portion 8 may induce the purge gas distributed by the purge unit 6 to flow to the outside toward the prevention surface 84.

The dispersion groove 82 may be provided in a circular cone shape where a size is reduced as the dispersion groove 82 extends in the downward direction DD (the arrow direction). Therefore, the dispersion groove 82 may be formed to have a maximum depth in a portion corresponding to the purge gas distribution region. Therefore, the substrate processing apparatus 1 according to the present inventive concept may be implemented so that a widest space is secured in a portion on which the purge gas distributed by the purge unit 6 concentrates through the dispersion groove 82. In this case, the dispersion groove 82 may be provided to have a maximum depth on the rotational shaft 3b of the disk 3. The dispersion groove 82 may be provided so that a depth becomes shallower as the dispersion groove 82 extends from a portion having a maximum depth to the outside toward the prevention surface 84.

The present inventive concept described above are not limited to the above-described embodiments and the accompanying drawings and those skilled in the art will clearly appreciate that various modifications, deformations, and substitutions are possible without departing from the scope and spirit of the invention.

The invention claimed is:

1. An apparatus for processing substrate, the apparatus comprising:
   a plurality of supporting parts, each of the plurality of supporting parts supporting a substrate;
   a disk supporting the plurality of supporting parts;
   a lid disposed apart from the disk;
   a first protrusion portion coupled to the disk to protrude in an upward direction from the disk to the lid in a center region disposed inward from the supporting parts and to protrude in the upward direction in between the supporting parts;
   a second protrusion portion protruding in the upward direction from an upper surface of the first protrusion portion in the center region; and
   a purge unit coupled to the lid and having holes formed therein for distributing a purge gas,
   wherein the second protrusion portion comprises a dispersion groove for dispersing the purge gas distributed by the purge unit,
   wherein the dispersion groove is provided on an upper surface of the second protrusion portion which is disposed to face the direction in which the purge gas is distributed from the purge unit,
   wherein the second protrusion portion is formed to increase a distance by which the upper surface of the second protrusion portion is spaced apart from the purge unit,
   wherein the dispersion groove is provided to have a size which is reduced as the dispersion groove extends in a downward direction from the purge unit to the second protrusion portion, and wherein surfaces of dispersion groove are inclined at an oblique angle to form a "V"-shaped groove.

2. The apparatus of claim 1, further comprising a gas groove disposed between the first protrusion portion and the supporting parts,
wherein the first protrusion portion protrudes in the upward direction from an upper surface of the disk at a position spaced apart from the supporting parts.

3. The apparatus of claim 2, wherein
the supporting parts support the substrates so that upper surfaces of the substrates are spaced apart from the upper surface of the disk by a first height in the upward direction, and
the first protrusion portion protrudes by a second height in the upward direction from the upper surface of the disk, and the second height is the same as the first height.

4. The apparatus of claim 1, wherein
the first protrusion portion comprises a plurality of accommodating grooves each accommodating a portion of a corresponding supporting part of the supporting parts, and
each of the accommodating grooves is concavely provided along a shape of a corresponding supporting part of the supporting parts.

5. The apparatus of claim 1, wherein
the first protrusion portion comprises a first accommodating groove accommodating a portion of a first supporting part of the supporting parts and a second accommodating groove accommodating a portion of a second supporting part of the supporting parts,
the first supporting part accommodated into the first accommodating groove and the first protrusion portion are disposed apart from each other by a first interval, and
the second supporting part accommodated into the second accommodating groove and the first protrusion portion are disposed apart from each other by a second interval differing from the first interval.

6. The apparatus of claim 1, wherein
the first protrusion portion comprises a first accommodating groove accommodating a portion of a first supporting part of the supporting parts and a second accommodating groove accommodating a portion of a second supporting part of the supporting parts,
the first supporting part accommodated into the first accommodating groove and the first protrusion portion are disposed apart from each other by a first interval, and
the second supporting part accommodated into the second accommodating groove and the first protrusion portion are disposed apart from each other by a second interval which is the same as the first interval.

7. The apparatus of claim 1, wherein the first protrusion portion comprises:
a center plate protruding in the upward direction in the center region; and
a plurality of protrusion members extended in an outward direction from the center plate to a region between the supporting parts.

8. The apparatus of claim 7, wherein
the supporting parts is coupled to the disk so that a center of each of the supporting parts is spaced apart from a center of the center plate by a rotational radius, and
each of the protrusion members is provided so that an end portion of each of the protrusion members spaced apart from the center of the center plate by a longest distance in the outward direction is disposed at a distance which is 0.9 to 1.1 times the rotational radius.

9. The apparatus of claim 7, wherein
the supporting parts is coupled to the disk so that a center of each of the supporting parts is spaced apart from a center of the center plate by a rotational radius, and
each of the protrusion members is provided so that an end portion of each of the protrusion members spaced apart from the center of the center plate by a longest distance in the outward direction is disposed at the rotational radius.

10. The apparatus of claim 1, wherein
the first protrusion portion comprises a center plate protruding in the upward direction in the center region and a plurality of protrusion members extended in an outward direction from the center plate to a region between the supporting parts, and
the second protrusion portion protrudes in the upward direction from an upper surface of the center plate.

11. The apparatus of claim 10, wherein the second protrusion portion is provided to have a size which is less than the center plate, so as to be disposed in the center plate.

12. The apparatus of claim 10, wherein
the center plate is provided to protrude by a first distance from the second protrusion portion with respect to a center connection line which connects a center of the center plate and a center of each of the supporting parts,
each of the supporting parts is disposed apart from the center plate by a second distance with respect to the center connection line, and
the second distance is equal to or shorter than the first distance.

13. The apparatus of claim 1, wherein an insertion groove, into which the second protrusion portion is inserted, is provided in the lid.

14. The apparatus of claim 13, wherein
the second protrusion portion is provided to have a size which is less than the insertion groove, so as to be spaced apart from an inner wall of the lid with the insertion groove provided therein, and
the purge unit distributes the purge gas to a region between the second protrusion portion and the inner wall of the lid with the insertion groove provided therein.

15. The apparatus of claim 13,
wherein the second protrusion portion comprises an induction groove for inducting a turbulent flow of the purge gas to be formed in the insertion groove.

16. The apparatus of claim 1, further comprising a distribution unit coupled to the lid, wherein
the distribution unit comprises a distribution hole distributing a process gas, and
the second protrusion portion protrudes in the upward direction from an upper surface of the first protrusion portion so that an upper end of the second protrusion portion is disposed at a position which is higher than a lower end of the distribution hole.

17. The apparatus of claim 1, wherein the second protrusion portion is detachably coupled to the first protrusion portion.

* * * * *